US012732157B2

(12) United States Patent
Ballandras et al.

(10) Patent No.: US 12,732,157 B2
(45) Date of Patent: Sep. 8, 2026

(54) REFLECTIVE STRUCTURE FOR SURFACE ACOUSTIC WAVE DEVICES (SAW)

(71) Applicant: Soitec, Bernin (FR)

(72) Inventors: Sylvain Ballandras, Besançon (FR); Emilie Courjon, Franois (FR); Florent Bernard, Besançon (FR); Thierry LaRoche, Besançon (FR); Julien Garcia, Chamblay (FR); Alexandre Clairet, Misereux Salines (FR)

(73) Assignee: Soitec, Bernin (FR)

( * ) Notice: Subject to any disclaimer, the term of this patent is extended or adjusted under 35 U.S.C. 154(b) by 380 days.

(21) Appl. No.: 18/247,629

(22) PCT Filed: Sep. 29, 2021

(86) PCT No.: PCT/EP2021/076840

§ 371 (c)(1),
(2) Date: Mar. 31, 2023

(87) PCT Pub. No.: WO2022/069573

PCT Pub. Date: Apr. 7, 2022

(65) Prior Publication Data

US 2023/0308074 A1 Sep. 28, 2023

(30) Foreign Application Priority Data

Oct. 1, 2020 (FR) ...................................... 2010072

(51) Int. Cl.
*H03H 9/02* (2006.01)
*H03H 9/145* (2006.01)

(52) U.S. Cl.
CPC .... *H03H 9/02574* (2013.01); *H03H 9/02559* (2013.01); *H03H 9/0259* (2013.01); *H03H 9/14538* (2013.01)

(58) Field of Classification Search
CPC ........... H03H 9/02574; H03H 9/02559; H03H 9/0259; H03H 9/14538; H03H 9/02566;
(Continued)

(56) References Cited

U.S. PATENT DOCUMENTS 4,290,033 A 9/1981 Kagiwada et al.
4,353,046 A 10/1982 Hartmann
(Continued)

FOREIGN PATENT DOCUMENTS

DE 10057848 A1 * 5/2002 ........... H03H 9/0028
DE 102019102341 A1 7/2020
(Continued)

OTHER PUBLICATIONS

Machine English Translation of DE10057848A1 (Year: 2002).*
(Continued)

*Primary Examiner* — Jorge L Salazar, Jr.
(74) *Attorney, Agent, or Firm* — TraskBritt

(57) ABSTRACT

A surface acoustic wave (SAW) device comprises an interdigitated transducer structure and at least one acoustic wave reflective structure provided on or in an acoustic wave propagating substrate. The interdigitated transducer structure comprises a first material and the at least one acoustic wave reflective structure comprises a second material different from the first material and/or the acoustic wave reflective structure and the interdigitated transducer structure have different geometrical parameters. A sensor comprises a SAW device as described herein, and a method is used for manufacturing a SAW device comprising at least one acoustic wave reflective structure.

25 Claims, 26 Drawing Sheets

(58) Field of Classification Search
CPC ........... H03H 9/02653; H03H 9/14541; H03H 9/02637
USPC .................................................. 333/193–196
See application file for complete search history.

(56) References Cited

U.S. PATENT DOCUMENTS

| | | | | |
|---|---|---|---|---|
| 5,418,866 | A | 5/1995 | Chu | |
| 5,568,001 | A | 10/1996 | Davenport | |
| 2003/0169129 | A1 | 9/2003 | Takamine | |
| 2006/0255884 | A1 | 11/2006 | Tanaka | |
| 2010/0123367 | A1 * | 5/2010 | Tai | H03H 9/02228 310/313 B |
| 2018/0013400 | A1 * | 1/2018 | Ito | H03H 9/14502 |
| 2018/0159498 | A1 * | 6/2018 | Castex | H03H 9/02834 |
| 2019/0089325 | A1 * | 3/2019 | Yanagitani | H03H 9/25 |

FOREIGN PATENT DOCUMENTS

| | | | |
|---|---|---|---|
| JP | 52-128036 | A | 10/1977 |
| JP | 1987-078906 | A | 4/1987 |
| JP | 02-260908 | A | 10/1990 |
| JP | 08-181561 | A | 7/1996 |
| JP | 10-107582 | A | 4/1998 |
| JP | 2003-188675 | A | 7/2003 |
| JP | 2005-347295 | A | 12/2005 |
| JP | 2007-202087 | A | 8/2007 |
| JP | 2018-137517 | A | 8/2018 |
| JP | 2019-507546 | A | 3/2019 |
| WO | 2017/131170 | A1 | 8/2017 |
| WO | 2020/021029 | | 1/2020 |
| WO | 2020/130076 | A1 | 6/2020 |

OTHER PUBLICATIONS

Machine English Translation of DE102019102341A1 (Year: 2020).*

Ballandras et al., A mixed finite element/boundary element approach to simulate complex guided elastic wave periodic transducers, J. Appl. Phys. 105 (1), 014911 (2009).

International Search Report for International Application No. PCT/EP2021/076840 dated Apr. 28, 2022, 6 pages.

International Written Opinion for International Application No. PCT/EP2021/076840 dated Apr. 28, 2022, 13 pages.

Japanese Notice of Refusal for Application No. 2023-518269 dated Jul. 8, 2025, 22 pages with English translation.

Japanese Notice of Reasons for Refusal for Application No. 2023-518269 dated Jan. 6, 2026, 19 pages with English translation.

Notice of Reasons for Refusal received for Japanese Patent Application No. 2023-518269, mailed on Jul. 14, 2026, 13 pages (6 pages of English Translation and 7 pages of Original Document).

* cited by examiner

| Material | Al-Cu (2%) | $Al_2O_3$ | AlN-ZX | GaN-ZX | $Ta_2O_5$ | $SiO_2$ | AT Quartz | LGS Std cut | LGS YX | $LiTaO_3$ | $LiNbO_3$ | Si |
|---|---|---|---|---|---|---|---|---|---|---|---|---|
| ρC shear bulk (MRayl) | 8.367 | 24.188 | 19.613 | 25.312 | 11.734 | 8.285 | 10.132<br>13.195 | 18.994 | 15.627<br>17.527 | 27.916 | 18.556 | 10.964<br>13.618 |
| ρC longi bulk (MRayl) | 17.63 | 44.475 | 33.536 | 48.783 | 36.998 | 13.142 | 15.158 | 32.187 | 32.997 | 41.657 | 30.301 | 19.667 |
| ρC Rayleigh (MRayl) | 7.325 | 22.439 | 18.280 | 22.610 | 9.843 | 6.797 | 8.368 | 15.822 | 14.064 | 25344 | 18.419 | 11.807 |
| ρC shear leaky SAW (MRayl) | 8.367 (SSBW) | 24.188 (SSBW) | 19.613 (SSBW) | 25.312 (SSBW) | 11.734 (SSBW) | 8.285 (SSBW) | 13.530 | 17.292 | 16.716 | 31.307 | 21.502 | 13.211 |

*FIG. 1C*

| Substr.\Obstacle | Al (co) | $Ta_2O_5$ | $LiTaO_3$ | $SiO_2$ | $Al_2O_3$ | $LiNbO_3$ | LGS | AlN | GaN | Pt (oc) | W (oc) | Mo (oc) | Ta (oc) |
|---|---|---|---|---|---|---|---|---|---|---|---|---|---|
| Std POI \|R\| (%) shear | 1.59 | 9.78 | 12.98 | 0.36 | 7.86 | 5.91 | 7.57 | 5.75 | 10.71 | 34.88 | 36.56 | 17,7 | 29,4 |
| AlN \|R\| (%) elliptic | 2,26 | 0.14 | 4.36 | 1.69 | 5.05 | 3.76 | 4.15 | 4.17 | 0.23 | 18.67 | 15.09 | 0 ! | 2.21 |
| $AlN/Al_2O_3$ \|R\| (%) elliptic | 1.80 | 16.55 | 2.4 | 1.28 | 3.86 | 3.02 | 3.24 | 3.19 | 3.82 | | | | |
| GaN \|R\| (%) elliptic | 0.95 | 3.2 | 2.09 | 0.91 | 3.16 | 1.79 | 1.39 | 2.63 | 2.76 | 3.70 | 5.08 | 3.23 | 1.50 |
| $GaN/Al_2O_3$ \|R\| (%) elliptic | 1.35 | 1.30 | 1.55 | 1.23 | 3.67 | 2.31 | 1.87 | 3.43 | 3.12 | 7.01 | 5.05 | 3.58 | 1.66 |
| LGS Std \|R\| (%) elliptic | 0.5 | 1.84 | 3.54 | 2.47 | 5.1 | 3.77 | 3.06 | 4.67 | 4.41 | 0.611 | 0.56 | 3.48 | 0.91 |

*FIG. 1D*

REFLECTIVE STRUCTURE FOR SURFACE ACOUSTIC WAVE DEVICES (SAW)

CROSS-REFERENCE TO RELATED APPLICATIONS

This application is a national phase entry under 35 U.S.C. § 371 of International Patent Application PCT/EP2021/076840, filed Sep. 29, 2021, designating the United States of America and published as International Patent Publication WO 2022/069573 A2 on Apr. 7, 2022, which claims the benefit under Article 8 of the Patent Cooperation Treaty to French Patent Application Serial No. FR2010072, filed Oct. 1, 2020.

TECHNICAL FIELD

The present disclosure relates to a surface acoustic wave (SAW) device comprising at least one reflective structure and to a sensor comprising such a device. The present disclosure also relates to a method for manufacturing such a SAW device.

BACKGROUND

Surface acoustic wave devices, and, in particular, resonator devices, have been employed in an increasing number of practical applications, such as filters and sensors. Surface acoustic waves are formed by inter-digitated transducers (IDT) provided on piezoelectric substrates. To reflect the surface acoustic waves and create a cavity, Bragg reflectors, formed by a large array of short-circuited metallic fingers, are provided on each side of the IDT. In a 1-port device, the IDT is receiving the electrical input signal to create the surface acoustic wave and is also measuring the reflected acoustic wave to provide an output signal. In 2-port devices, a second IDT is inserted into the cavity and used to sense the reflected wave. In SAW temperature sensors, a change in temperature results in a change in the resonant frequency that is detected by the output IDT.

The design of SAW devices has to be such that a plurality of parameters are satisfied. They comprise sufficient electro mechanical coupling, sufficiently high quality factor as well as high reflectivity of the Bragg mirrors. In the current designs, it is particularly difficult to provide a sufficiently high reflectivity at the same time as a compact design to allow integration in devices becoming smaller and smaller. This is, in particular, true for sensor applications.

Another field of interest are high temperature applications of SAW temperature sensors. In this context, high temperature relates to temperatures in excess of 500° C. State of the art temperature SAW sensors suffer from material property changes affecting their electrical response for high temperatures. The acoustic wave reflective structures of metals with high atomic numbers exhibiting melting temperatures above 1000° C., like Pt, Ta, W, Ir, Pd or Au, deteriorate at higher temperatures and/or show high variations of their physical properties, in particular, loss of reflectivity with higher temperatures. Other metals like Molybdenum, which presents high reflectivity values at high temperatures, are difficult to handle in an industrial manufacturing process due to their high melting point (more than 2500° C. for Mo).

BRIEF SUMMARY

The object of the present disclosure is therefore to overcome the above drawbacks by providing an alternative design for a surface acoustic wave device that provides a more compact design and/or is suitable for high temperature applications.

This object is achieved with surface acoustic wave (SAW) device comprising an interdigitated transducer structure and at least one acoustic wave reflective structure provided on or in an acoustic wave propagating substrate characterized in that the interdigitated transducer structure comprises a first material and the at least one acoustic wave reflective structure comprises a second material different from the first material and/or the acoustic wave reflective structure and the interdigitated transducer structure have different geometrical parameters. By allowing a designer to independently chose material and/or geometrical parameters of the mirrors and the IDT the important parameters of the SAW device like electro mechanical coupling, quality factor, reflectivity or temperature stability can be better optimized as more degrees of freedom are provided than in the prior art using the same metal for mirrors and the IDT as well as the same geometry. At the same time, the number of strips necessary in the mirrors can be reduced when the reflectivity is optimized, leading to compacter SAW devices.

According to a variant the acoustic impedance $\rho C_{ref}$ of the second material and the acoustic impedance $\rho C_{sub}$ of the acoustic wave propagating substrate can be matched, such that $$\frac{|\rho C_{ref} - \rho C_{sub}|}{\rho C_{sub}} \quad \text{[Math 1]}$$

is less than 50%, in particular, less than 25%. By choosing the materials such that the acoustic impedances match, an increase of the reflectivity can be observed.

According to a variant of the present disclosure, the first material and the second material are metals, in particular, the second material is one of platinum (Pt), tungsten (W), molybdenum (Mo) or tantalum (Ta). Using metals simplifies the fabrication process, in particular, lift-off fabrication process steps can be used, which can be sufficiently controlled, in particular, when using evaporation deposition techniques. According to an alternative Iridium (Ir) or Zirconium (Zr) could also be used as second material.

According to a variant of the present disclosure, the acoustic wave reflective structure can comprise a plurality of metallic strips electrically isolated from each other. According to yet another variant, the second material and its crystal orientation and the material of the acoustic wave propagating substrate and its crystal orientation are such that the electrical and mechanical contribution to acoustic wave reflection are out of phase. Thus, open circuit conditions are particularly favorable when using crystal orientation for which electrical and mechanical reflection effects are not in phase, e.g., like for Rayleigh waves on $LiNbO_3$ (YXl)/128° cut using aluminum (Al) strips. In that case, a destructive combination effect between mechanical and electrical reflection contribution can be prevented.

According to a variant of the present disclosure, the second material is a dielectric material. Surprisingly, using a dielectric material for the acoustic wave reflective structure provides reflectivity values at high temperatures, in particular, exceeding 500° C., which allow their use in high temperature applications. The variation of the reflectivity with temperature is also sufficiently low to be able to provide sensors with acceptable sensitivity in high temperature applications. Benefit is taken from the mechanical reflection effect, as there is no electrical reflection effect and therefore no risk for destructive combination. To benefit from this mechanical effect, the wave must be able to enter the obstacle. Thus, impedance matching as explained above can support the desired reflection.

According to a variant of the present disclosure, the surface acoustic wave device can further comprise a passivation layer provided only over the interdigitated transducer structure of the SAW device. The passivation layer protects the electrodes and thus improves the metal integrity of the IDT electrodes, in particular, for temperatures above 500° C.

According to a variant of the present disclosure, the passivation layer and the at least one reflective structure can be made of the same dielectric material. Both, the at least one reflective structure and the passivation layer, can therefore be provided during the same manufacturing step. Thus, even though different materials are used for the IDT and the acoustic wave reflective structure, the manufacturing process can be kept simple.

According to a variant, the acoustic wave propagating substrate can comprise aluminum nitride (AlN) as piezoelectric material and aluminum oxide ($Al_2O_3$) or lithium tantalate ($LiTaO_3$) or aluminum nitride (AlN) or langasite (LGS) as dielectric material. According to another variant, the acoustic wave propagating substrate can comprise langasite (LGS) as piezoelectric material and aluminum oxide ($Al_2O_3$) or aluminum nitride (AlN) or lithium niobate ($LiNbO_3$) or lithium tantalate ($LiTaO_3$) as dielectric material. According to a variant, the acoustic wave propagating substrate can comprises gallium nitride (GaN) as piezoelectric material and tantalum oxide ($Ta_2O_5$) or aluminum oxide ($Al_2O_3$) or gallium nitride (GaN) or aluminum nitride (AlN) or lithium niobate ($LiNbO_3$) or lithium tantalate ($LiTaO_3$) as dielectric material. For those materials high reflectivity as well as a high temperature stability can be observed.

According to a variant of the present disclosure, the acoustic wave propagating substrate can be a composite substrate comprising a piezoelectric layer over a base substrate, in particular, a Silicon base substrate or a Sapphire base substrate or even a Quartz substrate assuming propagation along appropriate axes, in particular, the so-called STW cut corresponding to YXlt)/36°/90°. A composite substrate can enhance the performance of the SAW devices and gives flexibility of design. The use of composite substrates, in particular, allows the use of acoustic waves other than Rayleigh waves, like shear waves or longitudinal waves guided by the piezoelectric layer.

According to a variant of the present disclosure, the piezoelectric layer can be lithium tantalate ($LiTaO_3$) and the dielectric material lithium tantalate ($LiTaO_3$) or tantalum oxide ($Ta_2O_5$) or aluminum oxide ($Al_2O_3$) or langasite (LGS) or gallium nitride (GaN). According to another variant, the piezoelectric layer can be lithium niobate ($LiNbO_3$) and the dielectric material lithium niobate ($LiNbO_3$) or tantalum oxide ($Ta_2O_5$) or aluminum oxide ($Al_2O_3$) or langasite (LGS). According to still another variant, the piezoelectric layer can be gallium nitride (GaN) and the dielectric material is aluminum oxide ($Al_2O_3$), or aluminum nitride (AlN), or lithium niobate ($LiNbO_3$), or langasite (LGS). For those materials, high reflectivity as well as a high temperature stability can be observed.

According to a preferred variant, the piezoelectric substrate can be piezoelectric on insulator (POI) substrate, in particular, with a $LiTaO_3$ (YXl)/42° layer on $SiO_2$ on a so called trap-rich polysilicon layer provided on a base substrate of Si(100). This type of substrate typically has a piezoelectric layer with thickness 600 nm, a $SiO_2$ layer of 500 nm and a trap-rich polysilicon layer of 1 μm. This POI substrate is particularly well suited for shear waves, longitudinal waves become accessible when using $LiTaO_3$ (YXlt)/42°/90° as top layer. A trap-rich layer can improve the isolation performance of the base substrate and may be formed by at least one of polycrystalline, amorphous, or porous materials such as, for instance, polycrystalline Silicon, amorphous Silicon, or porous Silicon. Under the term "trap-rich" one understands a layer that can absorb electrical charges without, however, forming a conductive layer.

According to a variant, the piezoelectric layer of the POI substrate is AlN or GaN. These materials also provide acoustic waves.

According to a variant, the piezoelectric layer can be lithium niobate ($LiNbO_3$) and the dielectric material lithium niobate ($LiNbO_3$) or tantalum oxide ($Ta_2O_5$) or aluminum oxide ($Al_2O_3$) or langasite (LGS). According to a variant, the piezoelectric layer can be gallium nitride (GaN) and the dielectric material is aluminum oxide ($Al_2O_3$) or aluminum nitride (AlN) or lithium niobate ($LiNbO_3$) or langasite (LGS) or gallium nitride (GaN). According to a variant, the piezoelectric layer can be aluminum nitride (AlN) and the dielectric material is tantalum oxide ($Ta_2O_5$) or aluminum oxide ($Al_2O_3$) or gallium nitride (GaN) or langasite (LGS) or aluminum nitride (AlN). For those materials high reflectivity values are observed.

According to a variant, the geometrical parameter can be one of the width or height of the acoustic wave reflective structure and the interdigitated transducer structure. Those parameters can be easily changed in standard layer deposition and patterning fabrication steps.

According to a variant of the present disclosure, the SAW device can comprise a first and a second acoustic wave reflective structure, one on either side of the interdigitated transducer structure, wherein the first and second reflective structures comprise two different materials and/or the acoustic wave reflective structures have different pitches. The two mirrors behaving differently, a differential sensor can be formed by simple means.

According to a variant, the SAW device can comprise two IDTs electrically connected to each other and separated from each other by an additional reflective structure. Such a design can be used in differential measurements, as the additional reflective structure improves the separation into two distinct resonant cavities. The additional reflective structure positioned between the two connected IDTs provides the reflectivity needed to function as a resonator in both cavities. Thus, compared to state of the art differential SAW devices, where the IDT is used both as a source of the acoustic waves and the reflector, the reflectivity is decoupled from the electromechanical coupling of the IDT, so that both can be designed independently from each other to satisfy the specifications of the device. In case two different pitches are used for the two mirrors, two additional reflecting structures with corresponding pitches can be provided in between the two IDTs.

According to a variant, the additional reflective structure comprises a third material different to the second material. Thus, the same advantages with respect to reflectivity and stability in high temperature applications can be achieved for the acoustic wave reflective structure between the two IDTs. Thus, according to the present disclosure, at least one of the additional reflective structure or the acoustic wave reflective structure within which the IDTs are arranged is made of a dielectric material.

According to a variant of the present disclosure, the at least one reflective structure can comprise less than 300 strips. Thus, using a dielectric material with improved reflectivity compared to metallic electrodes in the Bragg reflector, a compacter reflective structure compared to a metallic reflective structure can achieved. Thus, the overall size of the SAW device can be reduced. The number of strips typically depends on the application. For filters, the mirrors may be composed of 15-40 strips, whereas for resonant sensors for which electrode reflectivity is usually smaller more strips are needed but less than 300 remain sufficient.

The object of the present disclosure is also achieved by a sensor device for sensing a physical parameter comprising a SAW device as described previously. Due to the use of a dielectric material, the SAW sensor device can be used in high temperature applications, e.g., above 500° C. The physical parameters can be temperature, pressure, strain etc.

The object of the present disclosure is also achieved with a method for manufacturing a SAW device, in particular, as described above, comprising at least one acoustic wave reflective structure and an interdigitated transducer structure on or in an acoustic wave propagating substrate, and characterized in comprising a step a) of forming a dielectric layer on and/or in the acoustic wave propagating substrate and a step b) of patterning the dielectric layer to thereby form the at least one acoustic wave reflective structure. The manufacturing process of the SAW device according to the present disclosure with its improved reflectivity properties and temperature stability is compatible with the manufacturing process of standard SAW devices.

According to a variant of the present disclosure, step a) comprises forming the dielectric layer over the interdigitated transducer structure of the SAW device to thereby form a passivation layer over the transducer structure. Thus, the same deposition step can be used to realize the passivation layer of the IDT device to protect its metallic elements and the acoustic wave reflective structure at the same time. Thus, even though two different materials are used for the IDT and the acoustic wave reflective structure, the additional manufacturing efforts are limited, as the passivation layer and the acoustic wave reflective structures can be realized at the same time.

BRIEF DESCRIPTION OF THE DRAWINGS

The present disclosure may be understood by reference to the following description taken in conjunction with the accompanying figures, in which reference numerals identify features of the present disclosure.

FIG. 1C provides a table of acoustic impedance values.

FIG. 1D provides a table of calculated reflectivity values.

(%) for $Al_2O_3$-based electrodes for the AlN (YXl)/90° layer on a C-cut Sapphire wafer of the first embodiment of the present disclosure.

Figure 11A:
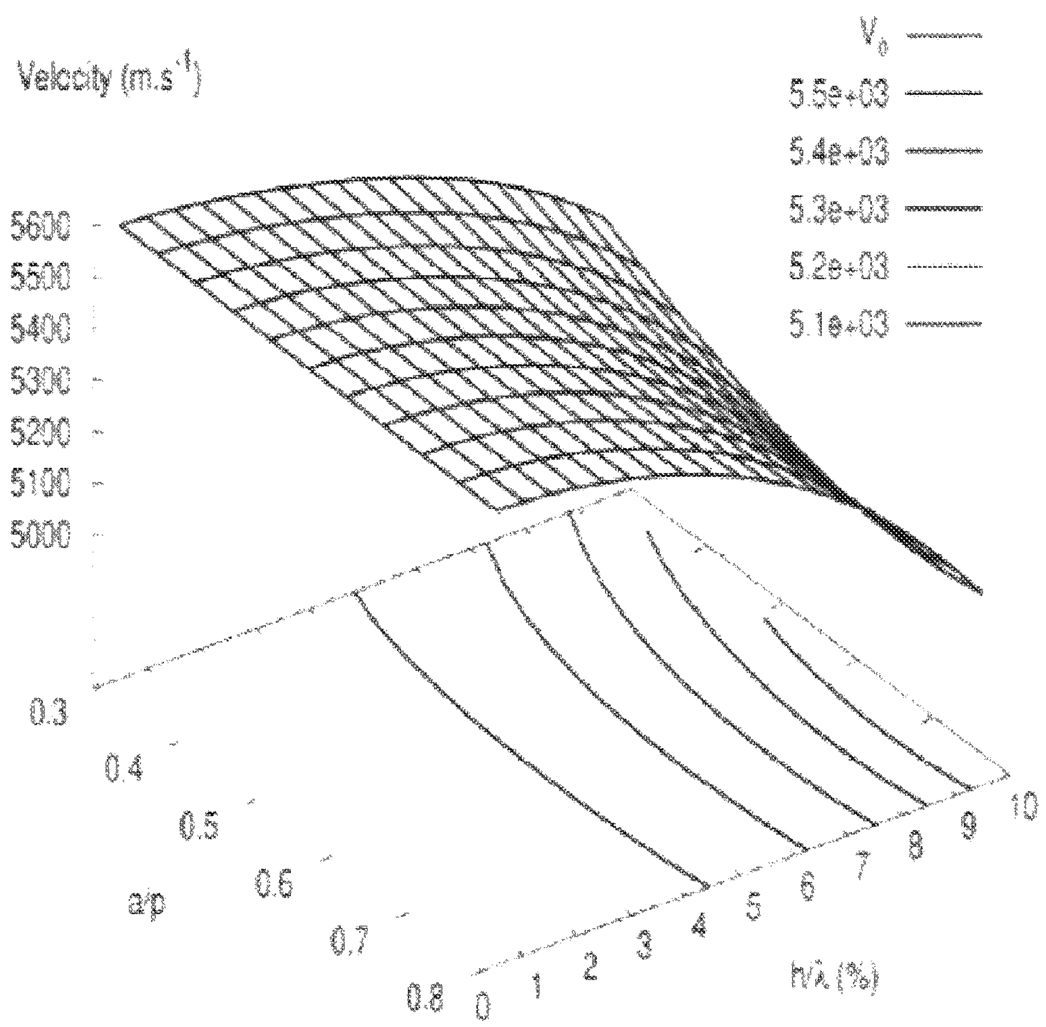
FIG. 11A shows the results of the computation of the variation of the velocity (m/s) versus the ratio a/p and h/λ
Figure 11B:
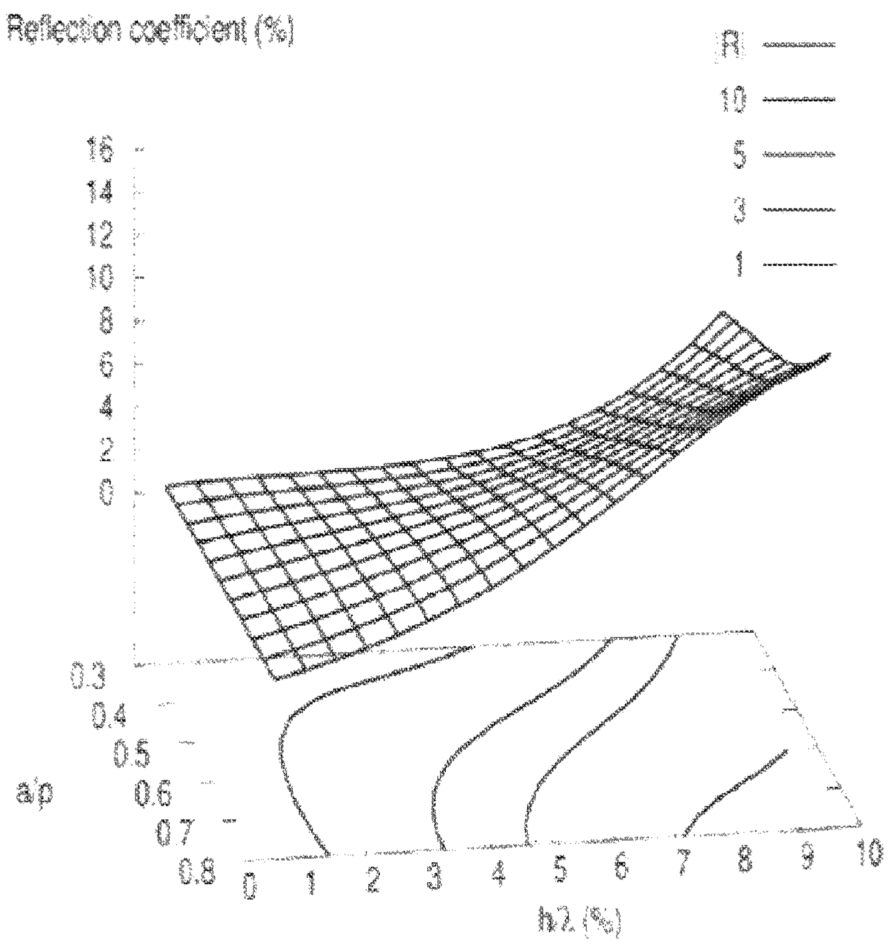

FIG. 11B shows the results of the computation of the variation of the reflection coefficient (%) versus the ratio a/p and h/λ (%) for $Al_2O_3$-based electrodes for the AlN (YXl)/90° layer on a C-cut Sapphire wafer of the first embodiment of the present disclosure.

Figure 12A:
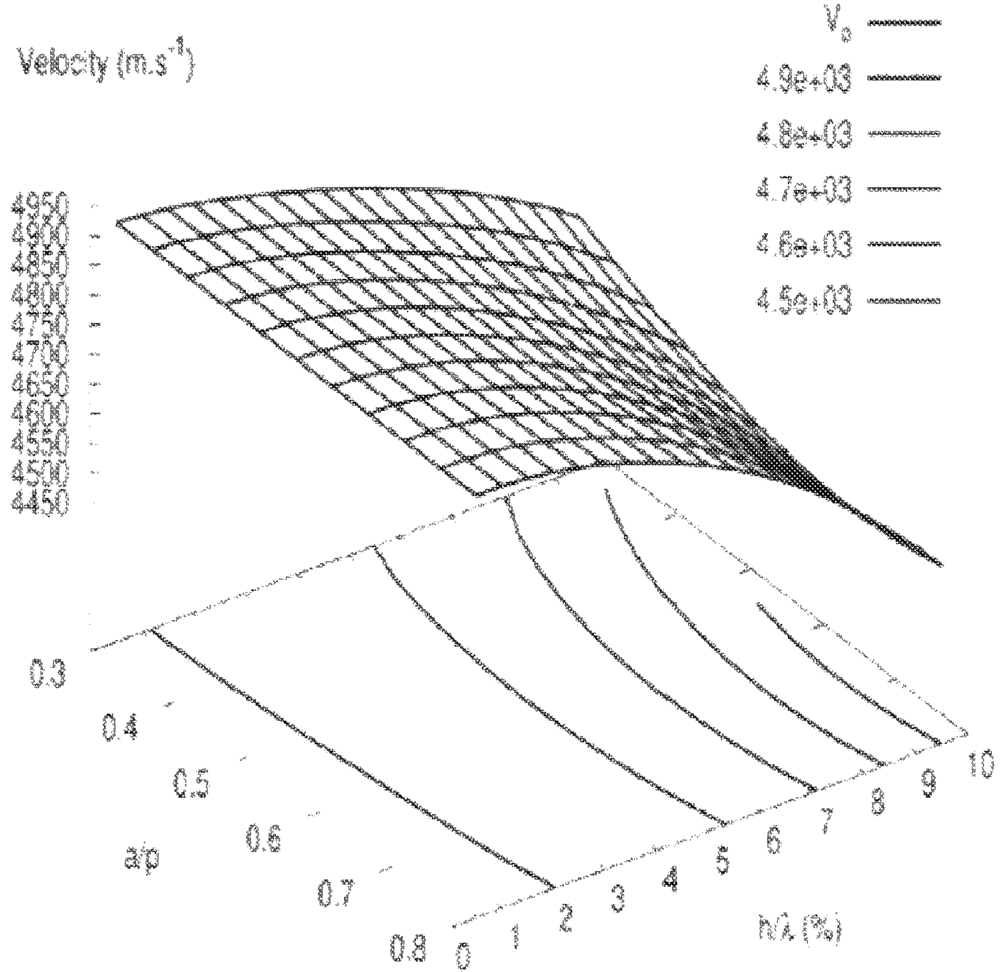

FIG. 12A shows the results of the computation of the variation of the velocity (m/s) versus the ratio a/p and h/λ (%) for $Al_2O_3$-based electrodes for the GaN (YXl)/90° layer on a C-cut Sapphire wafer of the first embodiment of the present disclosure.

Figure 12B:
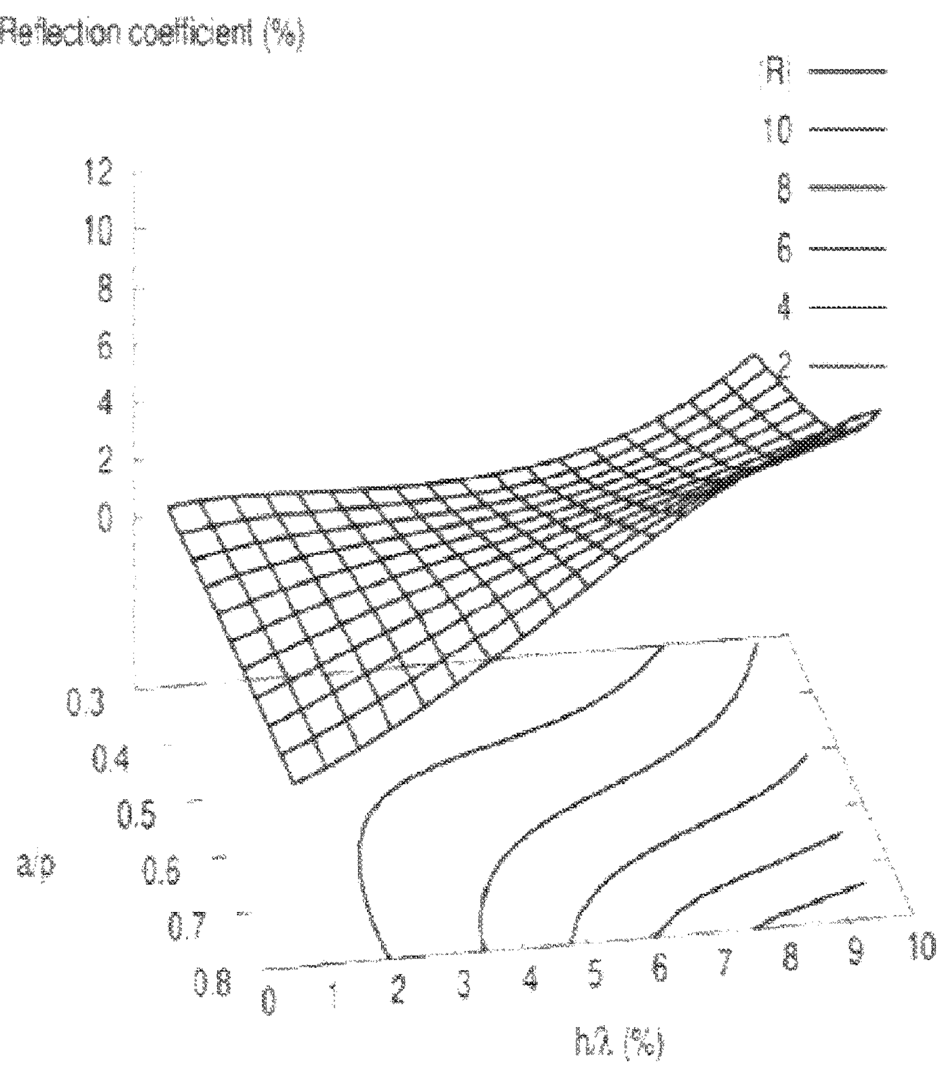

FIG. 12B shows the results of the computation of the variation of the reflection coefficient (%) versus the ratio a/p and h/λ (%) for $Al_2O_3$-based electrodes for the GaN (YXl)/90° layer on a C-cut Sapphire wafer of the first embodiment of the present disclosure.

Figure 13:
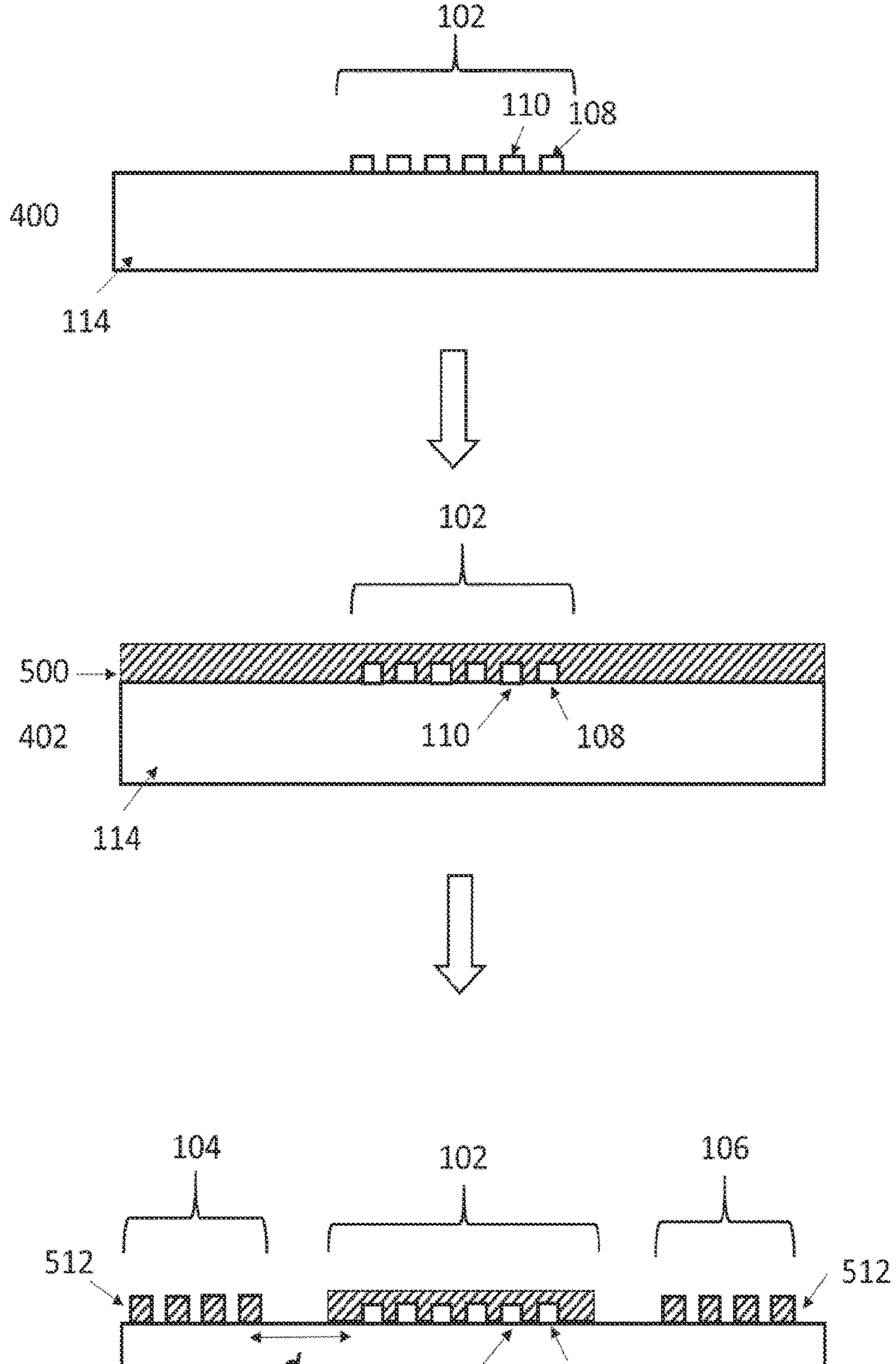

FIG. 13 illustrates a schematic of the steps of the method for manufacturing a surface acoustic wave SAW device according to a fifth embodiment of the present disclosure.

Figure 14:
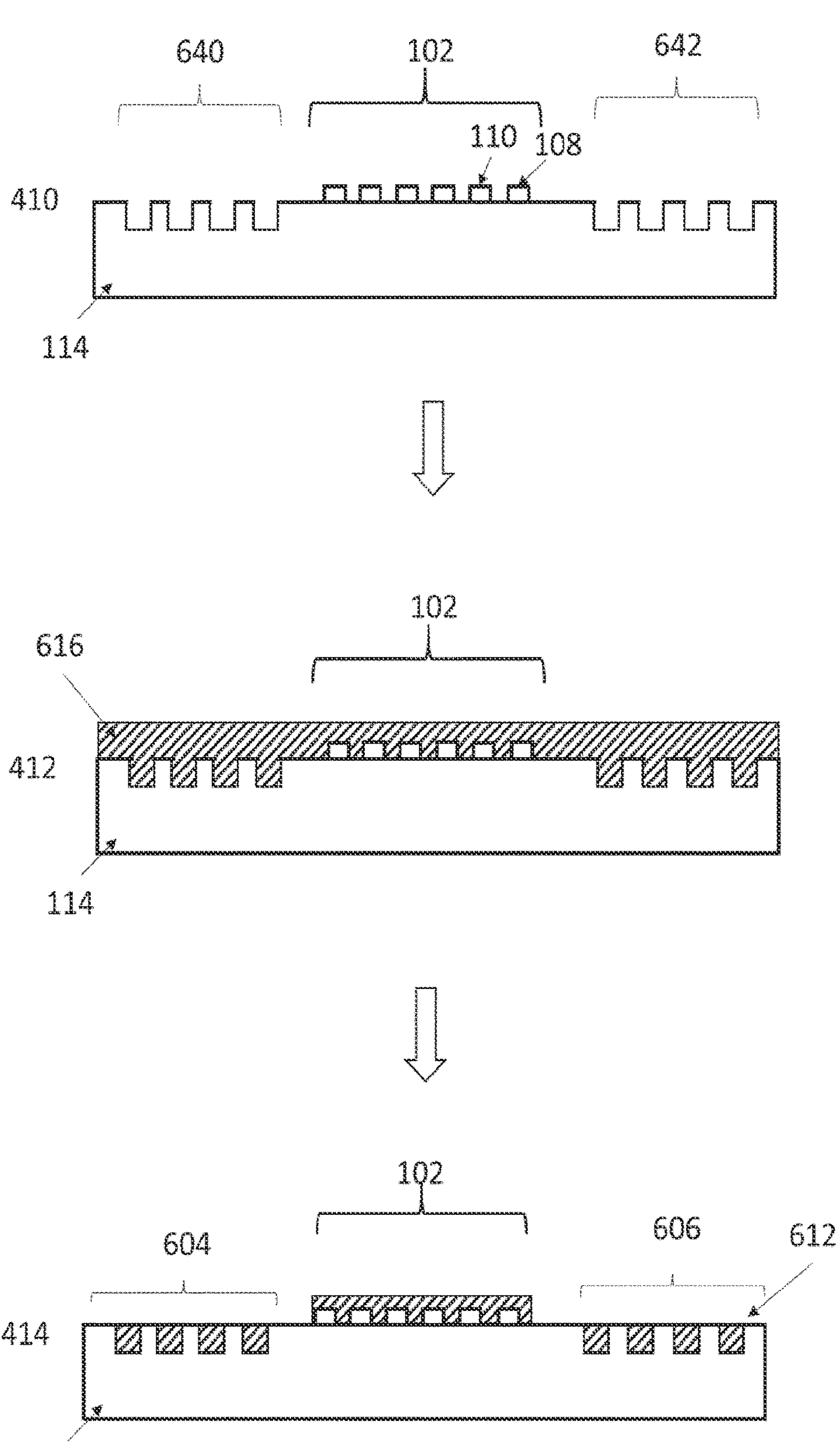

FIG. 14 illustrates a schematic of the steps of the method for manufacturing a surface acoustic wave SAW device according to a sixth embodiment of the present disclosure.

Figure 15:
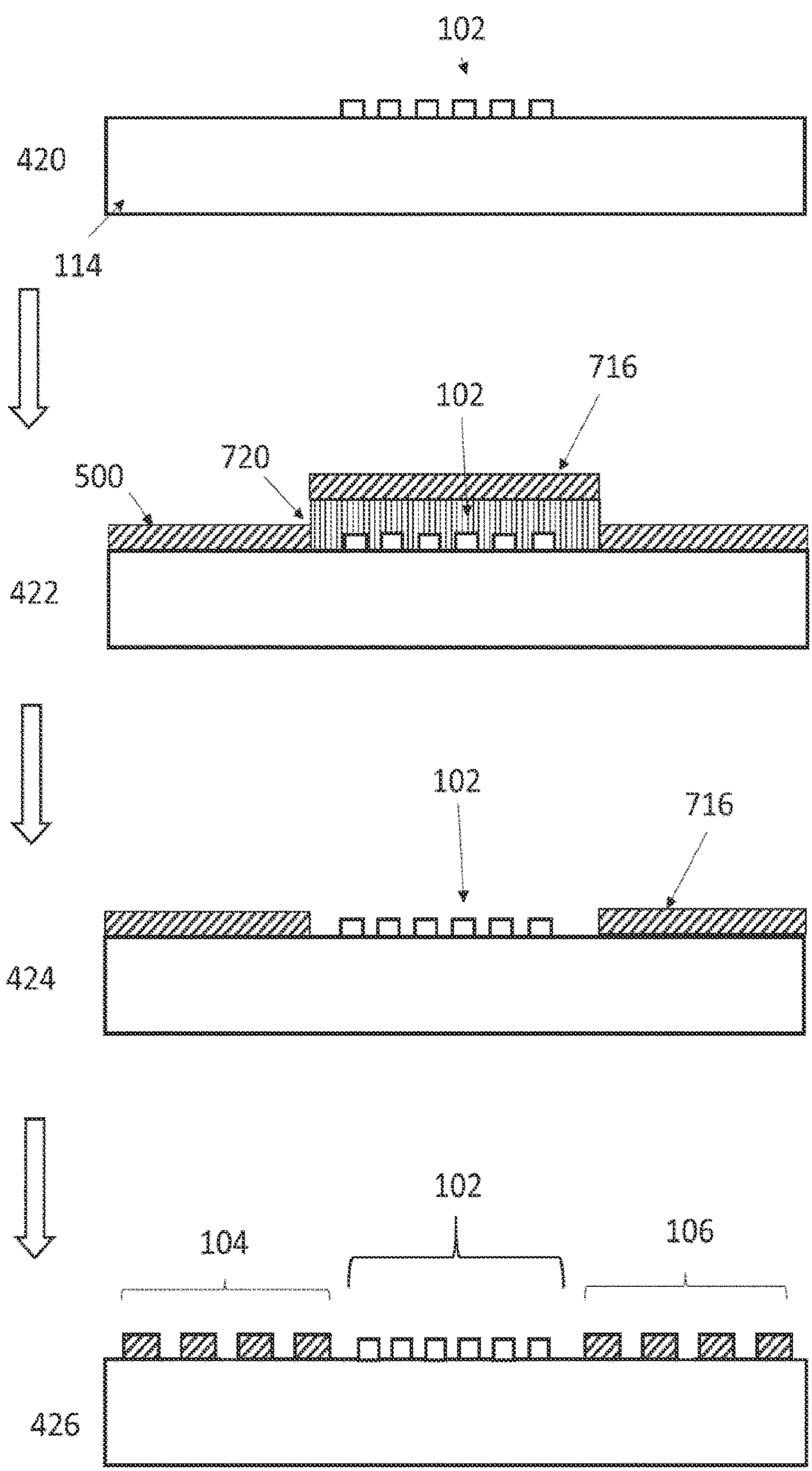

FIG. 15 illustrates a schematic of the steps of the method for manufacturing a surface acoustic wave SAW device according to a seventh embodiment of the present disclosure.

DETAILED DESCRIPTION

Figure 1A:
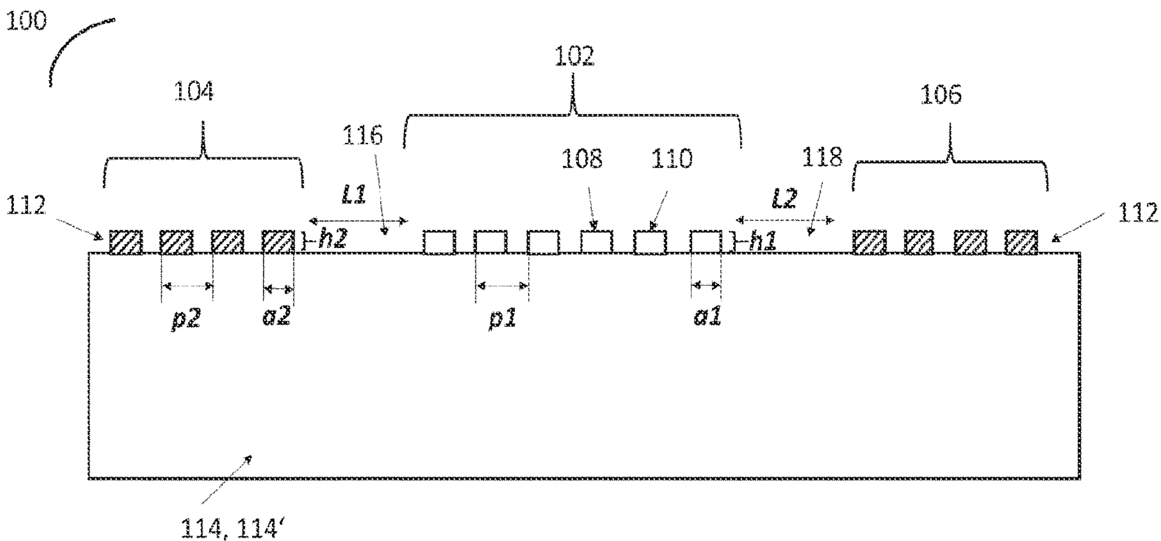
FIG. 1A shows a side view of a SAW device according to the first embodiment of the present disclosure.

FIG. 1A illustrates a surface acoustic wave (SAW) device 100 according to the present disclosure. The SAW device 100 in this embodiment is a single-port resonator comprising one inter-digitated transducer (IDT) structure 102 provided between two acoustic wave reflective structures 104, 106. In this embodiment, the transducer structure 102 is symmetrically positioned at a distance d with respect to the reflective structures 104, 106. The transducer structure 102 and its adjacent acoustic wave reflective structures 104, 106 form an acoustic cavity, the free space 116, 118 between IDT 102 and the acoustic wave reflective structures 104 and 106 have the dimensions L1 and L2, respectively. In this embodiment, the transducer structure 102 is symmetrically positioned thus L1=L2, but according to a variant L1 could also be different to L2.

The inter-digitated transducer structure 102 and the acoustic wave reflective structures 104, 106 are formed on an acoustic wave propagating substrate 114.

The acoustic wave propagating substrate 114 can be a bulk piezoelectric substrate, for example, lithium niobate ($LiNbO_3$), lithium tantalate ($LiTaO_3$), quartz ($SiO_2$), gallium orthophosphate ($GaPO_4$), langasite (LGS), aluminum nitride (AlN) or gallium nitride (GaN) or a composite substrate 114'.

The composite substrate 114' comprises a layer of piezoelectric material of a thickness of the order of the wavelength λ or smaller, in particular, a thickness of about 20 μm or less, formed over a base substrate. The piezoelectric layer can be a layer of lithium niobate ($LiNbO_3$), lithium tantalate ($LiTaO_3$), langasite (LGS), Aluminum Nitride (AlN) or Gallium Nitride (GaN). The base substrate can be a silicon or sapphire based substrate or a Quartz substrate assuming propagation along appropriate axes, in particular, the so-called STW cut corresponding to (YXlt)/36°/90°.

The composite substrate 114' can also be a piezoelectric on insulator (POI) substrate. According to one example, the piezoelectric layer is a $LiTaO_3$ (YXl)/42° layer on $SiO_2$ on a so called trap-rich polysilicon layer provided on a base substrate of Si(100). A trap-rich layer can improve the isolation performance of the base substrate and may be formed by at least one of polycrystalline, amorphous, or porous materials such as, for instance, polycrystalline Silicon, amorphous Silicon, or porous Silicon. Under the term "trap-rich" one understands a layer that can absorb electrical charges without, however, forming a conductive layer. Here the piezoelectric layer has a thickness of 600 nm, the $SiO_2$ layer a thickness of 500 nm and the trap-rich polysilicon layer a thickness of 1 μm. According to an alternative, the piezoelectric layer is AlN or GaN.

In the variant where the acoustic wave reflective structures 104, 106 and/or the transducer structure 102 is/are located at least partially within the acoustic wave substrate 114 and when the substrate 114 is a composite substrate, the acoustic wave reflective structure 104, 106 and/or the transducer structure 102 are at least partially embedded in the piezoelectric layer of the composite substrate.

The IDT 102 comprises opposing inter-digitated comb electrodes 108 and 110, each of which has a plurality of electrode fingers, respectively, being inter-digitated with each other. The electrodes and the electrode fingers 108 and 110 are made of a first material, namely of any suitable electrically conductive material, for example, Aluminum or an Aluminum alloy. In case of high temperature applications, e.g., beyond 500° C., the comb electrodes 108, 110 of the IDT 102 can be Ti/Pt, Ta/Pt, Ir, Zr, W, Mo electrodes as those metals are compatible with high temperatures.

As illustrated in FIG. 1A, the inter-digitated comb electrodes 108, 110 have a pitch p1 being defined as the edge-to-edge electrode finger distance, or more precisely left edge to left edge of the respective finger as illustrated, between two neighboring electrode fingers. The pitch p1 preferably satisfies the Bragg condition given by p1=λ/2, λ being the operating acoustic wavelength of the transducer structure. Thus, the transducer structure functions at the Bragg condition. In a variant, the transducer structure can also operate outside of the Bragg condition. The fingers of the interdigitated comb electrodes 108, 110 have a height h1 and width a1.

The acoustic wave reflective structures 104, 106 each comprise a plurality of parallel strips 112. According to the present disclosure, the strips 112 of the acoustic wave reflective structures 104, 106 are made of a second material different to the first material of the IDT 102. The strips have a width a2 and a height h2.

The acoustic wave reflective structures 104, 106 are defined by the pitch p2 of the strips 112, corresponding to the edge-to-edge (left edge to left edge) distance between the strips 112 within the acoustic wave reflective structures 104, 106 as illustrated in FIG. 1A. The pitch p2 of the strips 112 of the acoustic wave reflective structures 104, 106 in this embodiment is the same as the electrode pitch p1 of the transducer structure 102.

In a variant, the pitch p2 of the strips 112 of the acoustic wave reflective structures 104, 106 can be different to the electrode pitch p1 of the transducer structure 102 to form an asynchronous resonator. P1 and p2 are chosen in such a way that the acoustic wave reflective structure 104, 106 will have its reflection function spectral center at the synchronism frequency of the IDT 102. This reduces the electromechanical coupling of the resonator but increases its Q factor for a given mirror length and can improve the mirror compactness.

Even though p1 and p2 it is considered that both satisfy Bragg condition, which is due to the fact the IDT is not providing a Dirac function but a sin x/x function with a spectral spread allowing for two different pitches (different but, however, close one another).

Figure 1B:
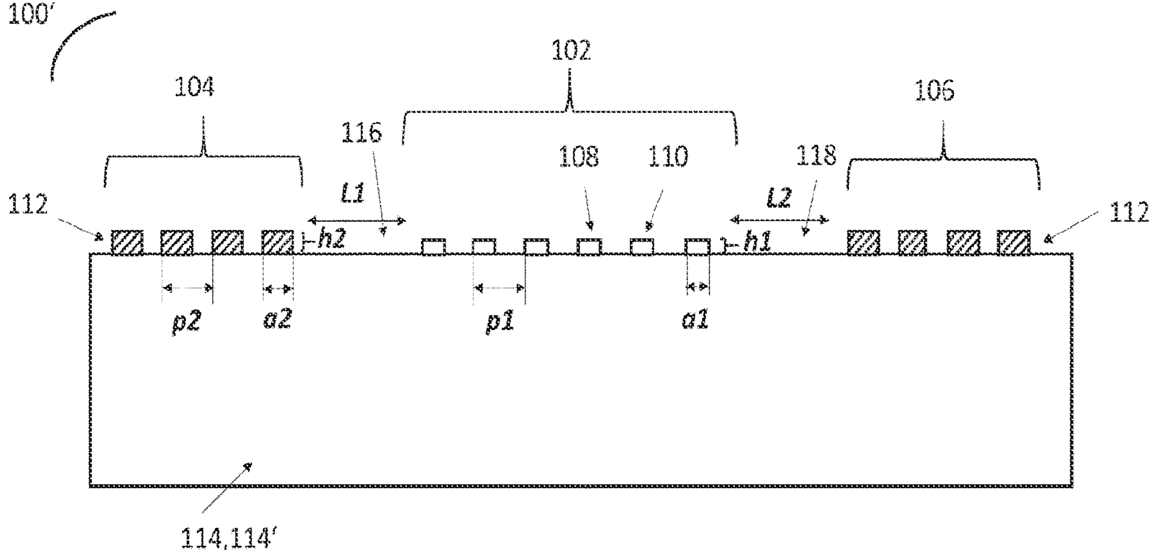
FIG. 1B shows a side view of a SAW device according to a variant of the first embodiment of the present disclosure.

In FIG. 1A, the height h2 and width a2 of the acoustic wave reflective structures 104 and 106 are the same as the height h1 and the width a1 of the electrode fingers of the IDT 102. The acoustic wave reflective structures 104, 106 and the IDT 102 are fabricated by distinct fabrication steps, it becomes, therefore, it is easy to realize different geometrical parameters to optimize the height and width of both with respect to each other to improve the overall device characteristics, e.g., with respect to electro mechanical coupling, the quality factor and reflectivity. Consequently, the pitch and/or height and/or width of the fingers of the IDT 102 and of the acoustic wave reflective structures 104, 106 could also be different as illustrated in FIG. 1B. Here a modified SAW device 100' with $a1<a2$ and $h1<h2$ is shown.

According to a first variant of the first embodiment, the first and second material are both metals but of different kind. The first material is chosen to optimize electro mechanical coupling and quality factor as a function of the piezoelectric substrate 114 or 114' whereas the second material is chosen to optimize or at least improve the reflectivity of the mirrors compared to a SAW device using the same material for the mirrors and the IDT. By doing so, the number of strips 112 needed for acoustic wave reflective structures 104, 106 can be reduced compared to state of the art SAW devices using the same metal for the IDT and the mirrors. Thus, the SAW device according to the present disclosure becomes more compact.

When using metallic strips 112 in the acoustic wave reflective structures 104, 106, they can be electrically isolated from each other so that only the acoustic part of the rules governing reflection of the acoustic waves needs to be taken into account as the metallic obstacle is in floating electrical condition. This is the case when the second material and its crystal orientation and the material of the acoustic wave propagating substrate 114, 114' and its crystal orientation are such that the electrical and mechanical contribution to acoustic wave reflection are out of phase. This is e.g., the case for Rayleigh waves on a $LiNbO_3$ (YXl)/128° cut using Al electrodes. In that case, a destructive combination effect between mechanical and electrical reflection contribution can be prevented.

According to a second variant of the first embodiment, the second material is a dielectric material. In this case the strips 112 can be either isolated from each other or connected with each other at the border, e.g., by a kind of a bus bar, which can improve the mechanical adherence.

As will be shown further below in a practical example, for a first group of dielectric materials e.g., aluminum nitride (AlN), gallium nitride (GaN), aluminum oxide ($Al_2O_3$), or silicon nitride ($Si_3N_4$) provided over a piezoelectric substrate of (YXlt)/48.5°/26.7° cut of LGS leads to higher reflectivity properties compared to metallic reflective structures. They also present an improved stability over temperature compared to the state of the art metallic reflecting structures.

For a second group of dielectric materials, e.g., dielectrics like $Ta_2O_5$ or silicon dioxide ($SiO_2$) on the same piezoelectric substrate, an improved stability with temperature compared to the state of the art reflecting structures comprising metallic strips is observed, which will be shown further down. At the same time sufficiently high reflectivity values are achieved as well, which makes them also suitable for high temperature applications.

Thus, the SAW device according to the present disclosure can be used for high temperature applications with an improved stability with variations in temperatures, compared to the state of the art SAW device.

The first group of dielectric materials provides the additional advantage that less strips 112, in particular, less than 300 strips, compared to metallic reflective structures using the same metal as the IDT, need to be provided to achieve a sufficient high overall reflectivity. Thus, the acoustic wave reflective structures 104, 106 according to the present disclosure can be compacter leading to a reduced overall size of the SAW device 100. This is particularly true for Rayleigh waves on composite substrates like GaN or AlN on Silicon or Sapphire for which the strip reflectivity is always much smaller than 1% for an electrode height in the IDT allowing for an effective wave coupling, in particular, when in short circuit conditions.

It appears that higher reflectivity values can be observed when the acoustic impedance $\rho C_{ref}$ of the acoustic wave reflecting structures 104, 106 and the acoustic impedance $\rho C_{sub}$ of the acoustic wave propagating substrate are chosen such that they are matched, thus as close as possible or at least such that $$\frac{|\rho C_{ref} - \rho C_{sub}|}{\rho C_{sub}} \quad \text{[Math 2]}$$

is less than 50%, in particular, less than 25%. In case the impedance values are completely matched, the obstacles cannot be embedded completely into the piezoelectric.

This is illustrated by the tables shown in FIGS. 1C and 1D.

FIG. 1C illustrates the acoustic impedance for various materials as a function of the type of acoustic wave.

Starting from that data, for a given form, here rectangular cross sections of the strips 112, a period p of 1 μm, and obstacle ration a/p of 0.5 and a relative height h/λ of 5% the reflectivity was computed for Rayleigh type acoustic waves at room temperature, thus 25° C. It should be noted that for both dielectric and metallic materials only the acoustic part of the problem, i.e., the reflection due to the obstacle without electrical boundary condition rupture was solved by numerical simulation. In fact, the obstacle is in floating electrical conditions.

High reflectivity values per strip, see FIG. 1D, are obtained when acoustic impedances of the substrate and the obstacle material were close, in particular, as close as possible. The results were obtained by numerical simulation realized the following way: the wave is assumed propagating under an infinite periodic grating composed of similar obstacles of the mentioned material. There is no consideration on the way the wave is excited. The stop-band is determined by computing the determinant of the matrix relating together the degrees of freedom of the problem (called FEM/BEM system) and tracking the zeros versus frequency. For metal obstacles, the open circuit electrical condition (oc) is assumed, which means that all grating electrodes are independent and the corresponding global electrical charge is naught for each electrode. In table of FIG. 1D, the first line relates to a standard POI substrate (std POI), which is the POI substrate as defined above.

In addition to the practical examples given in FIG. 1D, a POI substrate with $LiNbO_3$ (YXl)/41° 500 nm on 1 μm $SiO_2$ on a 1 μm trap-rich layer on Si (111) with $Ta_2O_5$ a reflectivity of R=8.9% is observed. For a metallic strip a reflection value of R=17.3% is obtained for Mo in open-circuit configuration.

To give a more accurate example of compact reflectors, a reflector using shorted Al strips on a POI substrate with a piezoelectric layer of $LiTaO_3$ (YXl)/42° layer on $SiO_2$ on a trap-rich polysilicon layer provided on a base substrate of Si(100) as described above, is analyzed. Here the piezoelectric layer has a thickness of 600 nm, the $SiO_2$ layer a thickness of 500 nm and the trap-rich polysilicon layer a thickness of 1 μm, a 10% to 15% reflection coefficient per strip is observed. Looking at the table of FIG. 1D, even higher reflectivity values can be observed for other metals in open circuit condition, like Pt, W, Mo or Ta. Thus, acoustic wave reflecting structures with less than 50 strips can be used yielding high Q factors, compatible with the wireless sensor application. Thus, generally speaking, single obstacle reflection coefficients in excess of 10% allow for reducing the mirror length to less than 100 strips/obstacles.

The single port resonator 100 functions the following way. The inter-digitated transducer converts the electrical energy of an incident electrical signal into acoustic wave energy. The acoustic wave travels across the surface of the substrate 114 and is reflected back to the IDT 102 by the acoustic wave reflective structures 104, 106 located on the acoustic wave propagation direction. At the resonance frequency, the condition of synchronism between the acoustic wave reflective structures 104, 106 is satisfied making it possible to obtain a coherent addition of the different reflections, which occur under the acoustic wave reflective structures. A maximum of acoustic energy is then observed within the resonant cavity and, from an electrical point of view, a maximum of amplitude of the current admitted by the transducer is observed. As an example, single port resonators can be used as SAW tag devices that can be remotely interrogated when connected to an antenna.

Figure 2:
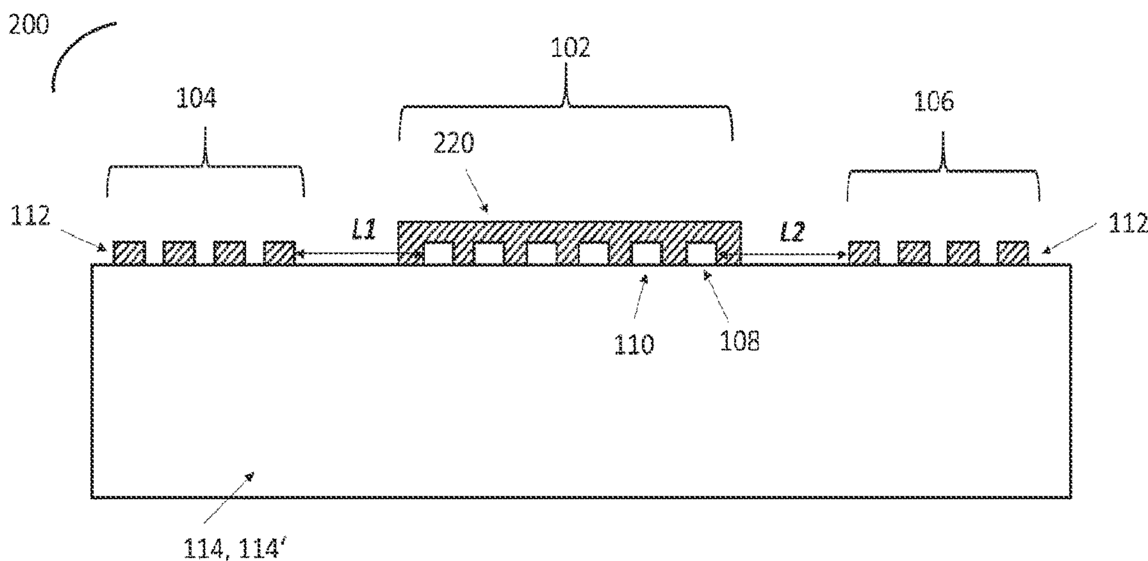
FIG. 2 shows a side view of a SAW device according to a second embodiment of the present disclosure.

FIG. 2 shows a second embodiment of the present disclosure. The only difference between the first embodiment in the variant using a dielectric as second material and the second embodiment is the presence of a passivation layer 220 over the transducer structure 102. Features carrying the same reference numeral as in FIG. 1A will not be described again, but reference is made thereto.

The passivation layer 220 is only present over the inter-digitated transducer structure 102 to protect the electrodes. The passivation layer 220 is preferably made of the same dielectric material as the strips 112 of the acoustic wave reflective structures 104, 106 in case the second material is a dielectric material. Both elements of the device can thus be fabricated during the same processing step as will be described further down. In a variant of the embodiment, different dielectric materials can be used for the passivation layer and the strips of the acoustic wave reflective structures.

Figure 3A:
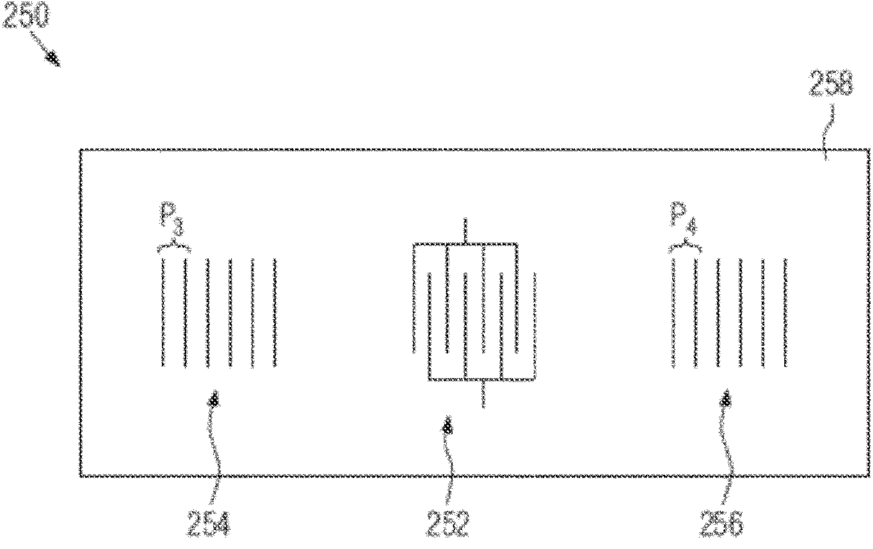
FIG. 3A shows a top view of a SAW device according to a third embodiment of the present disclosure.

FIG. 3A illustrates a third embodiment according to the present disclosure. In this embodiment, the SAW device 250 is a differential sensor. The differential sensor 250 comprises an interdigitated transducer (IDT) structure 252 placed between two acoustic wave reflective structures 254 and 256 formed on a piezoelectric substrate 258. The IDT 252 corresponds to the IDT 102 of the first or second embodiment, the piezoelectric substrate 258 corresponds to the substrate 114 of the first embodiment. In this embodiment, the first and second reflective structures 254 and 256 comprise two different materials with respect to each other and/or have a different pitch p3, p4.

With one mirror having one dielectric on one side and the other mirror with the other dielectric on the other sides, the resonance frequencies yield a differential behavior. The same effect is obtained for using different pitches p3 and p4.

Figure 3B:
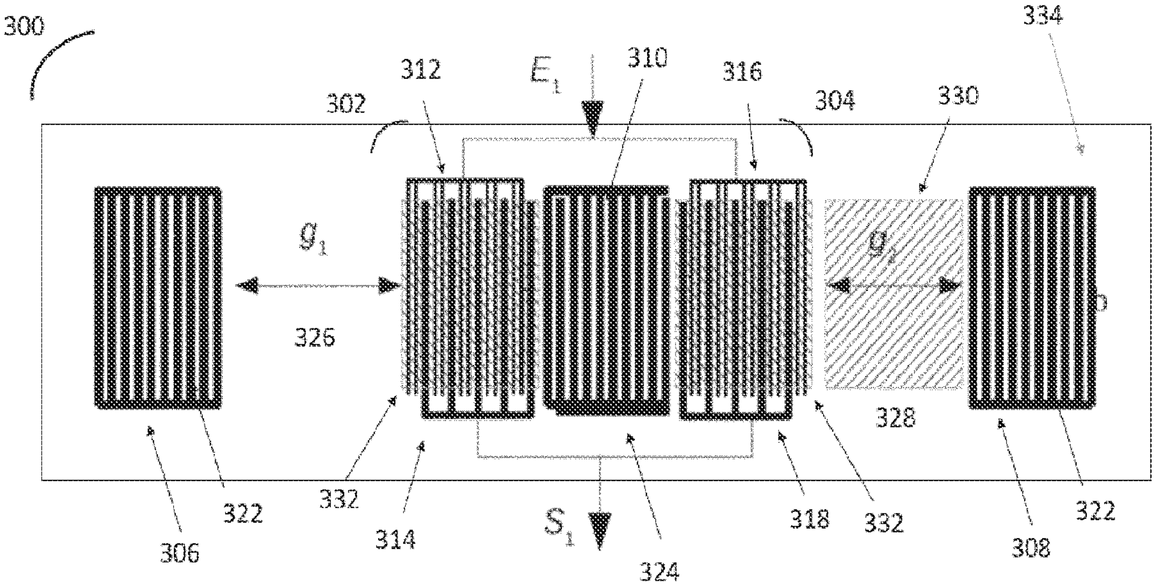
FIG. 3B shows a top view of a SAW device according to a fourth embodiment of the present disclosure.

FIG. 3B illustrates a fourth embodiment according to the present disclosure. In this embodiment, the SAW device 300 is a hybrid differential sensor.

The hybrid differential sensor 300 comprises two inter-digitated transducer structures 302, 304 placed between two acoustic wave reflective structures 306 and 308 and an additional reflective structure 310 positioned between the two IDTs 302, 304 formed on a piezoelectric substrate 334. The piezoelectric substrate 334 corresponds to the substrate 114 of the first embodiment.

In this embodiment, the comb electrodes 312, 314 of the IDT 302 and the comb electrodes 316, 318 of the IDT 304 have the same geometry. Furthermore, the two IDTs 302 and 304 are electrically connected to each other. The comb electrodes 312 and 316 form the input, indicated by E1, and comb electrodes 314 and 318 form the output, indicated by S1.

In this embodiment, the IDTs 302 and 304 can be configured to operate at the Bragg condition or can be designed to function out of the Bragg condition. Working out of Bragg condition might be useful to reduce directivity effects.

The acoustic wave reflective structure 306 is positioned at a distance g1 to IDT 302. The acoustic wave reflective structure 308 is positioned at a distance g2 to IDT 304. Each acoustic wave reflective structure 306, 308 comprises one or more strips 322. The strips have the same pitch as the electrodes of the IDTs. The additional reflective structure 310 also comprises a plurality of strips 324. The number of strips 324 is the same or different compared to the acoustic wave reflective structures 306, 308. They are in an open configuration when an electrically conductive material is used and the electrical and mechanical contributions to the reflection are out of phase. When a dielectric material is used, the strips can be connected or not, e.g., using a bus bar like structure.

According to the present disclosure, at least one, preferably all of the acoustic wave reflective structures 306, 308, including the additional reflective structure 310, are made of a dielectric material or metallic material different from the one of the IDT as described above with respect to the first and second embodiments. Again, dielectric and metallic strips in the mirrors and IDT can have the same or different heights and/or the same or different widths.

The region 326 located between a reflective structure 306 and its adjacent transducer structure 302 forms an acoustic cavity 326 with width g1. In the same way, the region 328 located between the reflective structure 308 and its adjacent transducer structure 304 forms another acoustic cavity 328 with width g2.

The one cavity, e.g., 326 is covered by a layer of $Al_2O_3$, which exhibits a negative temperature compensation of frequency (TCF) value and the other cavity 328 by $SiO_2$, which exhibits a positive TCF. Therefore, the two cavities behave differently when submitted to temperature changes that yield a different behavior of the resulting frequency changes and then allows for a differential measurement by subtracting one frequency from the others. Thus, a differential value can be sensed by the SAW sensor 300.

Furthermore, a passivation layer is formed over the transducer structures 302, 304. In a variant, the passivation layer can extend over the additional reflective structure 310 in case it has metallic strips 324. The passivation layer can also extend over the cavity 326. Typically, the passivation layer is made of the same material as the dielectric material used for at least one of the acoustic wave reflective structures.

In a variant of the present disclosure, like in the first embodiment, the reflective structures 306, 308 and/or the additional reflective structure 310 can be embedded at least partially in the piezoelectric layer or piezoelectric substrate 334.

Introducing the additional reflective structure 310 between the two IDTs has the advantage that the formation of the second cavity is independent of the design of the IDT. In particular, for high temperature applications above e.g., 500° C., it is possible to focus on the electromechanical coupling and stability of the IDT and separately to focus on sufficient high reflectivity, e.g., by using a dielectric material, for the mirror.

In a further variant, the second reflective structure 308 might have a different pitch compared to the first reflective structure 306, in this case the additional reflective structure 310 needs to be split into two parts, each part having the pitch of one of the acoustic wave reflective structures 306, 308.

In the following, the advantageous effect of using dielectric reflecting structures will be explained by comparing it to reflective structures using the same geometrical dimensions of the acoustic wave reflective structures but the same metallic material than the IDT, the same metallic materials and shape of the IDT and the same piezoelectric substrate.

In the following, the non-homogeneous part of the problem is simulated via a finite element mesh comprising a part of the substrate, a fraction of the top layer, and the reflecting structure. The substrate is simulated by boundary elements using the Green's function of the medium surface, i.e., its acousto-electric impulse response. This approach is detailed in, for example, S. Ballandras, R. Lardat, M. Wilm, Th. Pastureaud, A. Reinhardt, N. Champavert, W. Steichen, W. Daniau, V. Laude, R. Armati, G. Martin, "A mixed finite element/boundary element approach to simulate complex guided elastic wave periodic transducers," J. Appl. Phys. 105 (1), 014911 (2009).

FIGS. 4 to 11 describe the simulated results concerning Rayleigh waves.

Figure 4A:
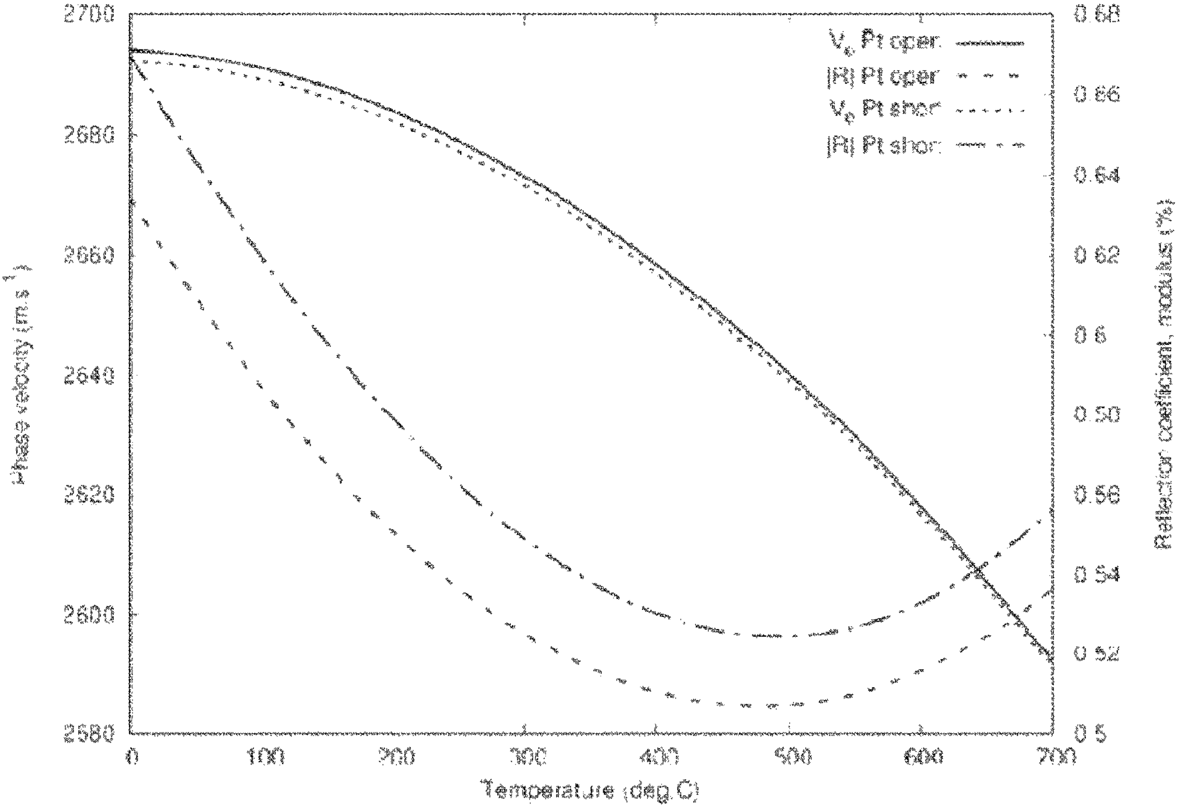
FIG. 4A shows the simulated dispersion properties of phase velocity and reflectivity for Pt and Ta according to examples of the state of the art.
Figure 4B:
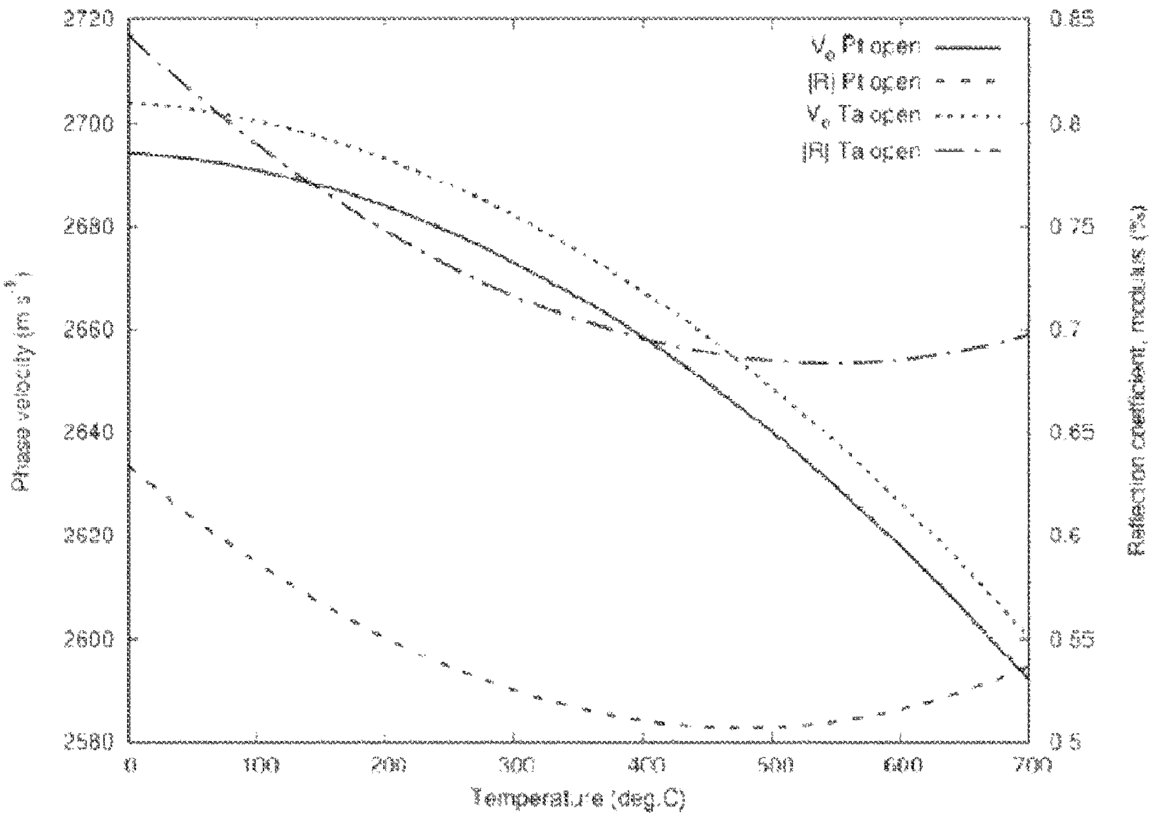
FIG. 4B shows the simulated dispersion properties of phase velocity and reflectivity for Pt and Ta according to examples of the state of the art.

FIGS. 4A and 4B illustrate the simulated dispersion properties for excitation and reflection of surface acoustic waves according to two examples of the state of the art, for Rayleigh-like waves propagating under infinite periodic gratings operating at Bragg conditions on the (YXlt)/48.5°/26.7° cut of LGS. The surface ratio, namely the ratio between the electrode width and grating pitch or mechanical period a/p is fixed to 0.5, and the relative electrode thickness, namely the ratio between absolute electrode height and wavelength h/λ, is fixed to 1%. A wavelength λ of 10 μm was set, thus the height h was 100 nm.

The IDT used for excitation and detection of surface acoustic waves comprises either Pt or Ta-based electrodes, had the same geometry as the periodic grating of the acoustic wave reflective structure. The material for the IDT is the same as for the acoustic wave reflective structure.

In the case of Pt-based electrodes, FIG. 4A shows that wave reflection on a single reflective electrode is below 0.7% and varies by more than 10% with temperature, whatever the operation condition of the acoustic wave reflective structure, open or short-circuit. As can be seen in FIG. 4B, Ta-based electrodes are slightly better than Pt-based electrodes but still far below 1%, and the variation with temperature is about the same for both metals.

The phase velocities observed under the reflective structures are such that matching with the velocities under the IDT can be achieved.

Figure 5A:
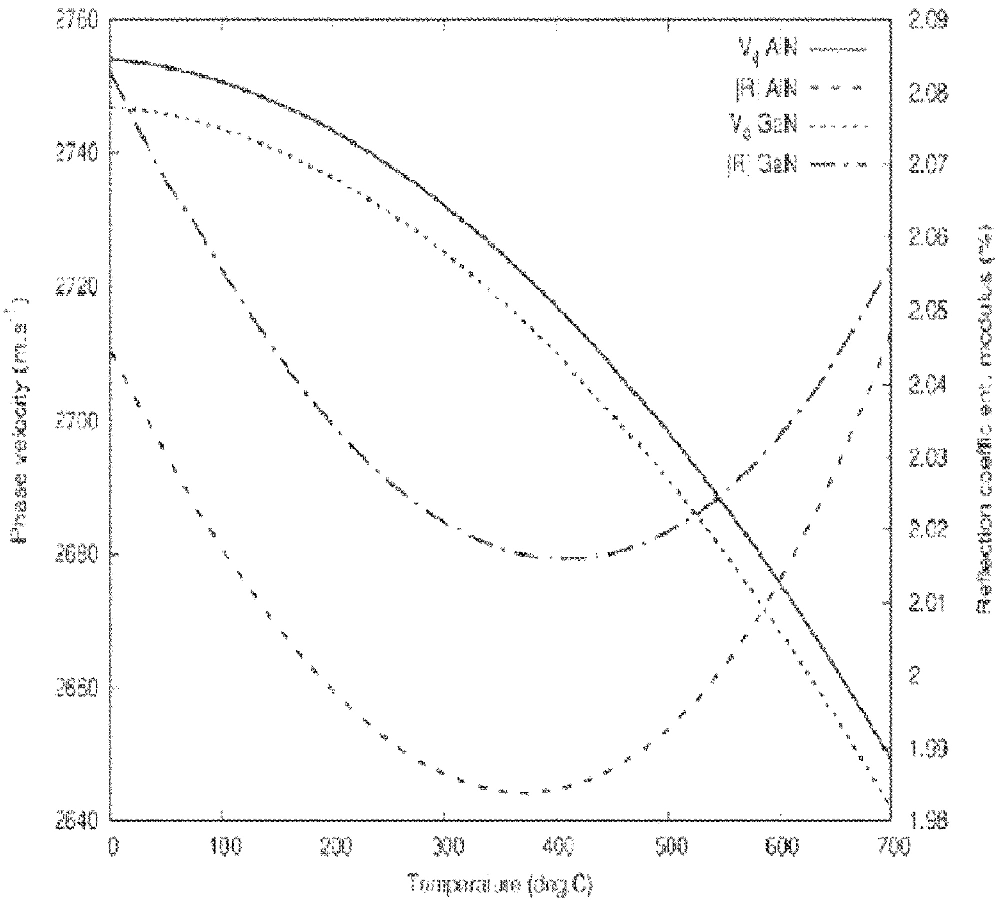
FIG. 5A shows the simulated dispersion properties of phase velocity and reflectivity for AlN and GaN according to the first embodiment of the present disclosure.
Figure 5B:
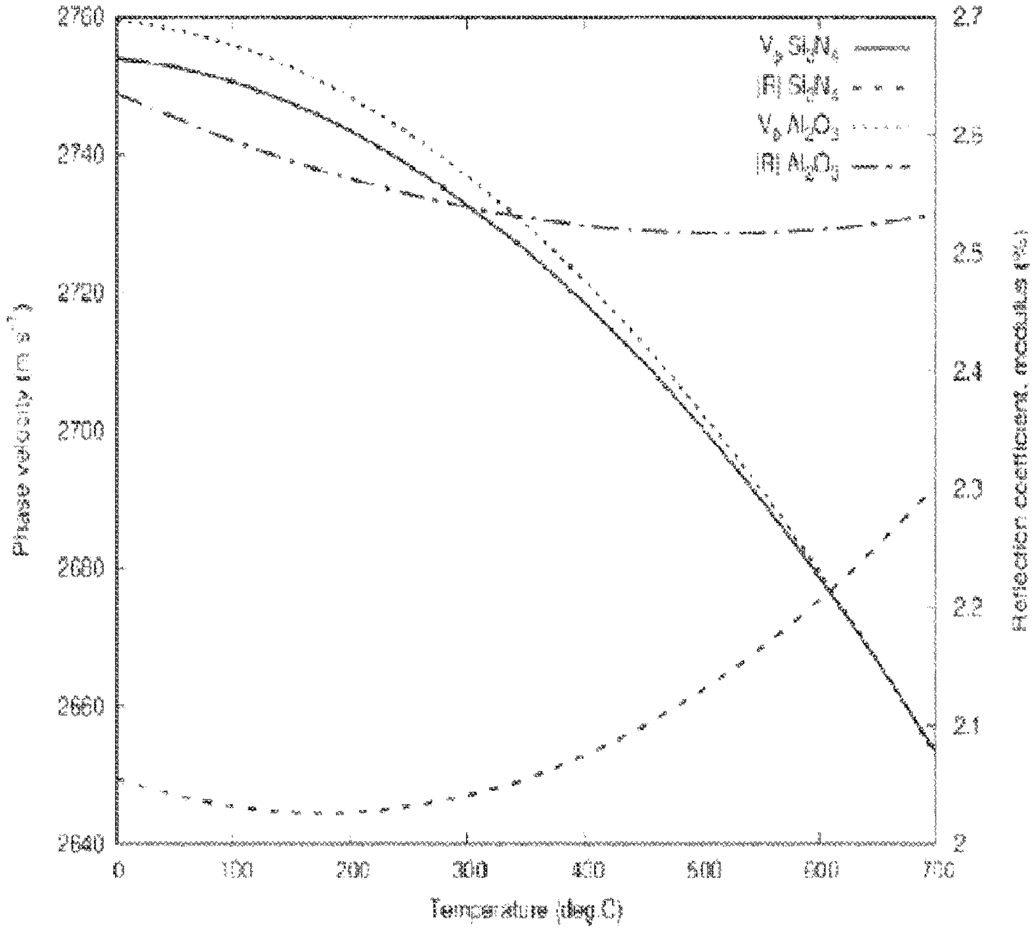
FIG. 5B shows the simulated dispersion properties of phase velocity and reflectivity for $Si_3N_4$ and $Al_2O_3$ according to the first embodiment of the present disclosure.
Figure 5C:
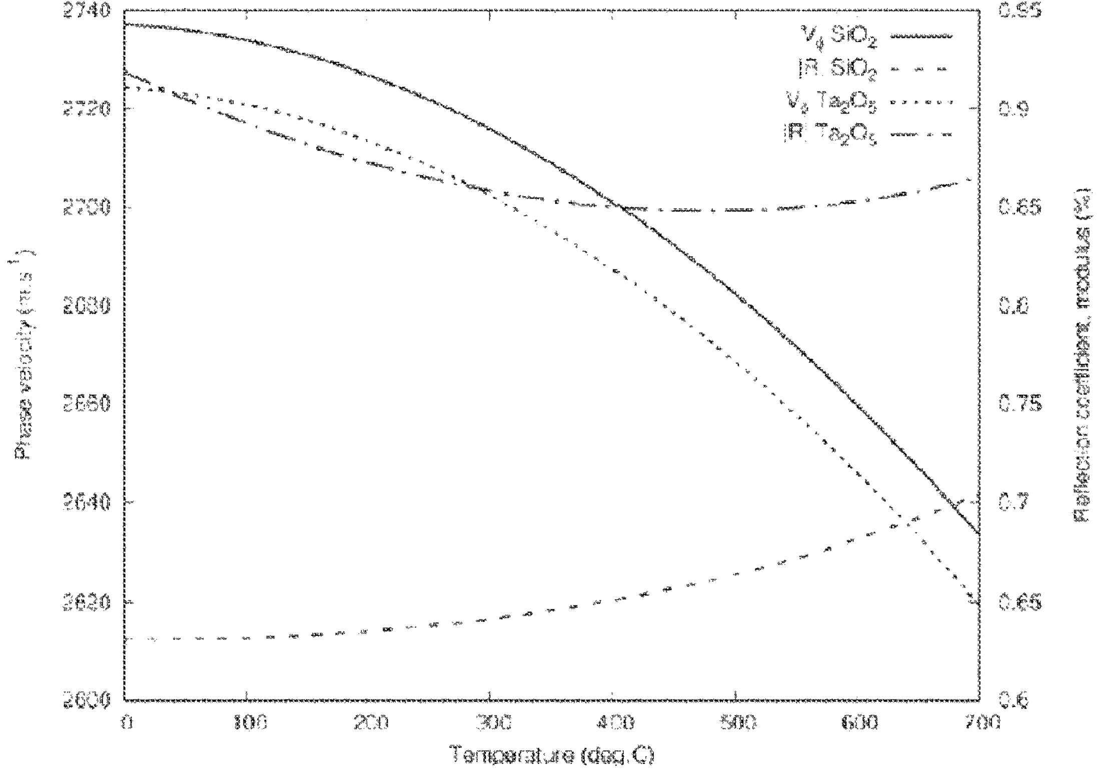
FIG. 5C shows the simulated dispersion properties of phase velocity and reflectivity for $SiO_2$ and $Ta_2O_5$ according to the first embodiment of the present disclosure.

FIGS. 5A-5C show the same type of graphs as FIGS. 4A and 4B, with the same IDT structure, but with reflective structures according to the present disclosure, thus with strips based on dielectric materials, namely here AlN, GaN (FIG. 5A) $Al_2O_3$, $Si_3N_4$, (FIG. 5B) and $SiO_2$ and $Ta_2O_3$ (FIG. 5C). With dielectric materials no separation in open and short-circuit like in FIG. 4A is needed, as no electrical contribution needs to be taken into account.

FIG. 5A corresponds to a comparison between AlN strips and GaN strips. For GaN, a reflectivity varying between about 2.02% and 2.09% is observed over a temperature range of 0° C. to 700° C. For AlN, a reflectivity varying between about 1.98% to 2.05% is observed over the same temperature range. Thus, for both dielectric materials, the reflectivity is higher compared to the metallic electrodes and a lower variation of the reflectivity as a function of temperature of the order of 2% is observed.

FIG. 5B corresponds to a comparison between $Al_2O_3$ and $Si_3N_4$ strips. For $Si_3N_4$, the reflectivity essentially increases with temperature from about 2.05% up to 2.3%, thus showing a variation in temperature of the order of 5%. Regarding $Al_2O_3$, the reflectivity varies between 2.54% and 2.6% with a rather small variation of less than 2% over the entire temperature range, and nearly constant above 500° C.

FIG. 5C corresponds to a comparison between $SiO_2$ and $Ta_2O_5$ strips. Both materials illustrate a lower reflectivity compared to dielectric materials of FIGS. 5A and 5B. For $SiO_2$, an increase in reflectivity with temperature 0.64% up to 0.7%, is observed thus with a variation in temperature of the order of 5%. Regarding $Ta_2O_5$, a reflectivity is slightly better varying between 0.85% and 0.92%, thus a variation of less than 5%.

The dielectric materials $SiO_2$ and $Ta_2O_5$, yield thus lower reflectivity compared to dielectric materials AlN, GaN, $Al_2O_3$, or $Si_3N_4$, and are actually comparable to those of the heavy metal Ta, for example, cited above, but the variation of the reflectivity with temperature, in particular, above 500° C. is better than for the metals.

FIGS. 6 to 9 show the results of the computation of the variation of (a) the phase velocity (m/s) and (b) the reflection coefficient (%) versus the ratio a/p and h/λ (%) for the LGS (YXlt)/48.5°/26.7° cut and various dielectric materials used for the electrodes at fixed temperature of 25° C.

Figure 6A:
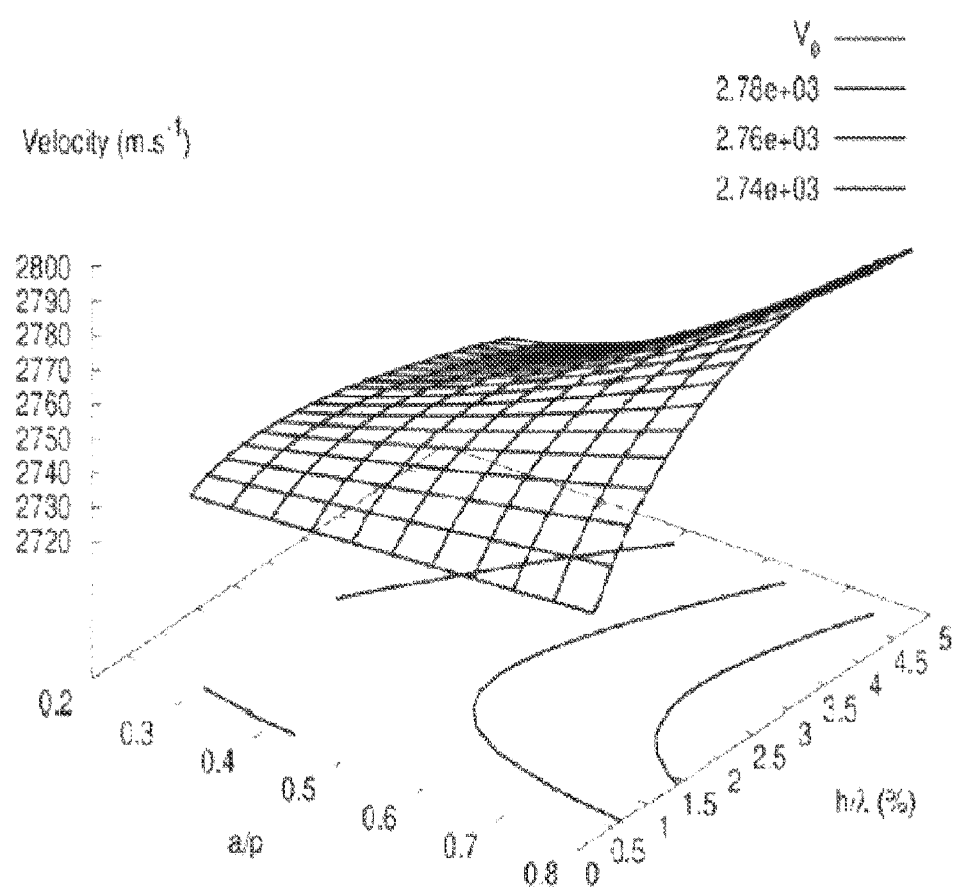
FIG. 6A shows the results of the computation of the variation of the velocity (m/s) versus the ratio a/p (width a of the metal strip over the grating period p) and h/λ (%) (height h of the electrode over the acoustic wavelength λ also equal to twice the grating period p) of $Si_3N_4$ as reflective grating obstacle material for Rayleigh waves on LGS (YXlt)/48.5°/26.7° of the first embodiment of the present disclosure.
Figure 6B:
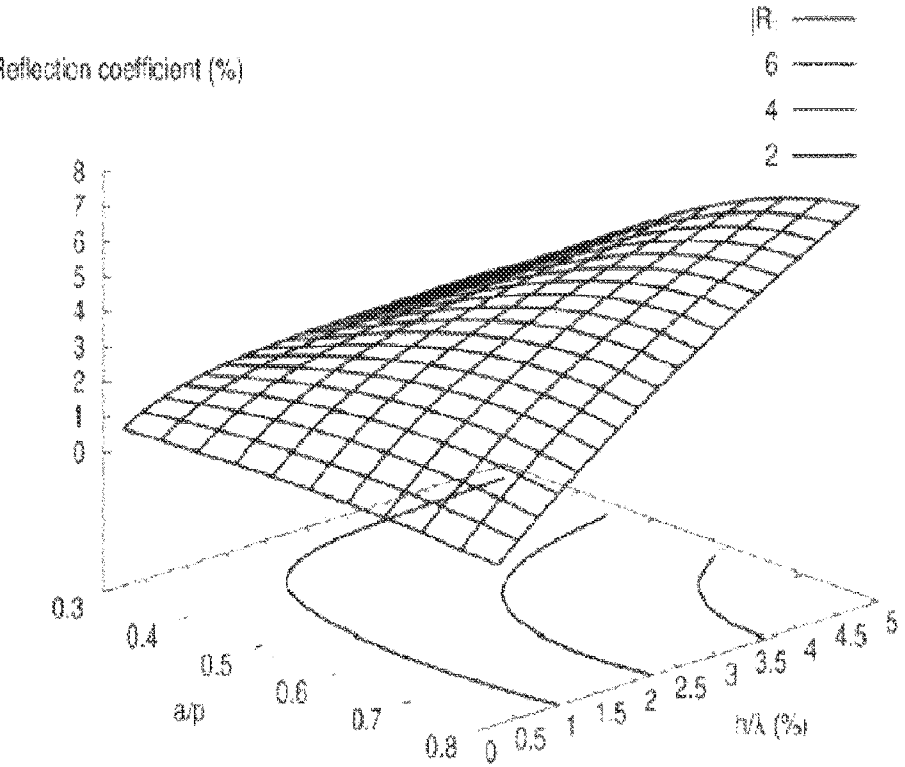
FIG. 6B shows the results of the computation of the variation of the reflection coefficient (%) versus the ratio a/p (width a of the metal strip over the grating period p) and h/λ (%) (height h of the electrode over the acoustic wavelength λ also equal to twice the grating period p) of $Si_3N_4$ as reflective grating obstacle material for Rayleigh waves on LGS (YXlt)/48.5°/26.7° of the first embodiment of the present disclosure.

FIGS. 6A and 6B show the results of the computation for $Si_3N_4$-based electrodes.

Figure 7A:
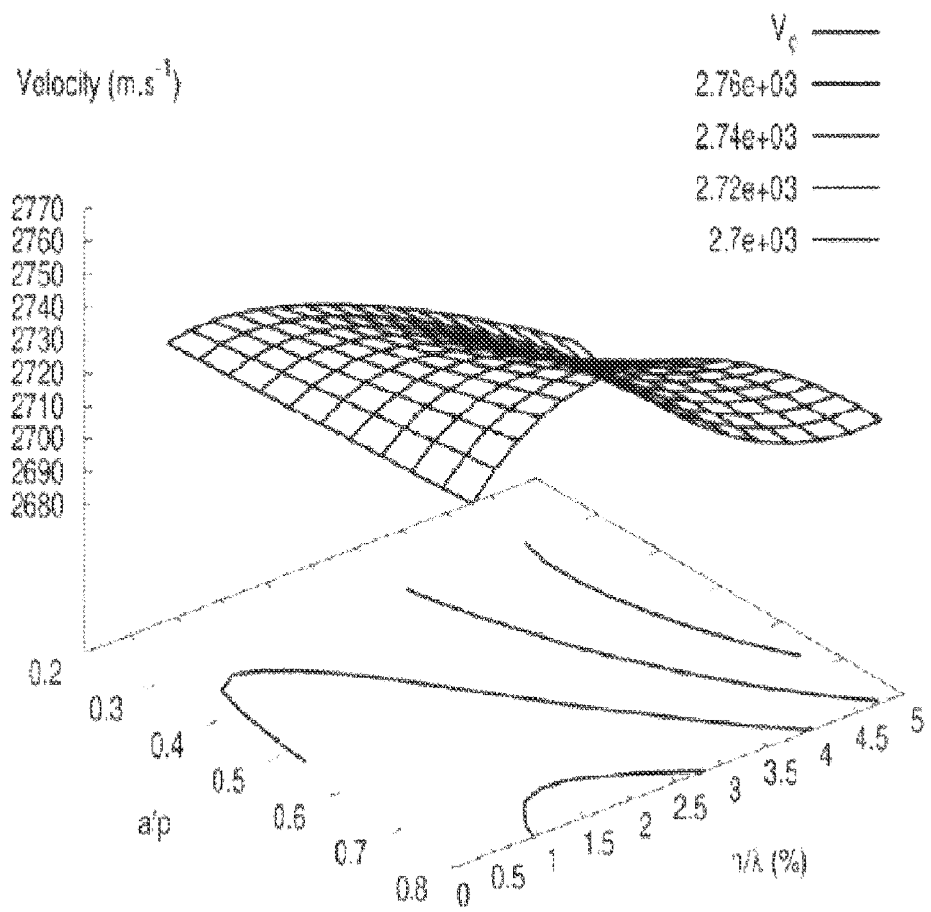
FIG. 7A shows the results of the computation of the variation of the velocity (m/s) versus the ratio a/p and h/λ (%) of AlN as reflective grating obstacle material for Rayleigh waves on LGS (YXlt)/48.5°/26.7° of the first embodiment of the present disclosure.
Figure 7B:
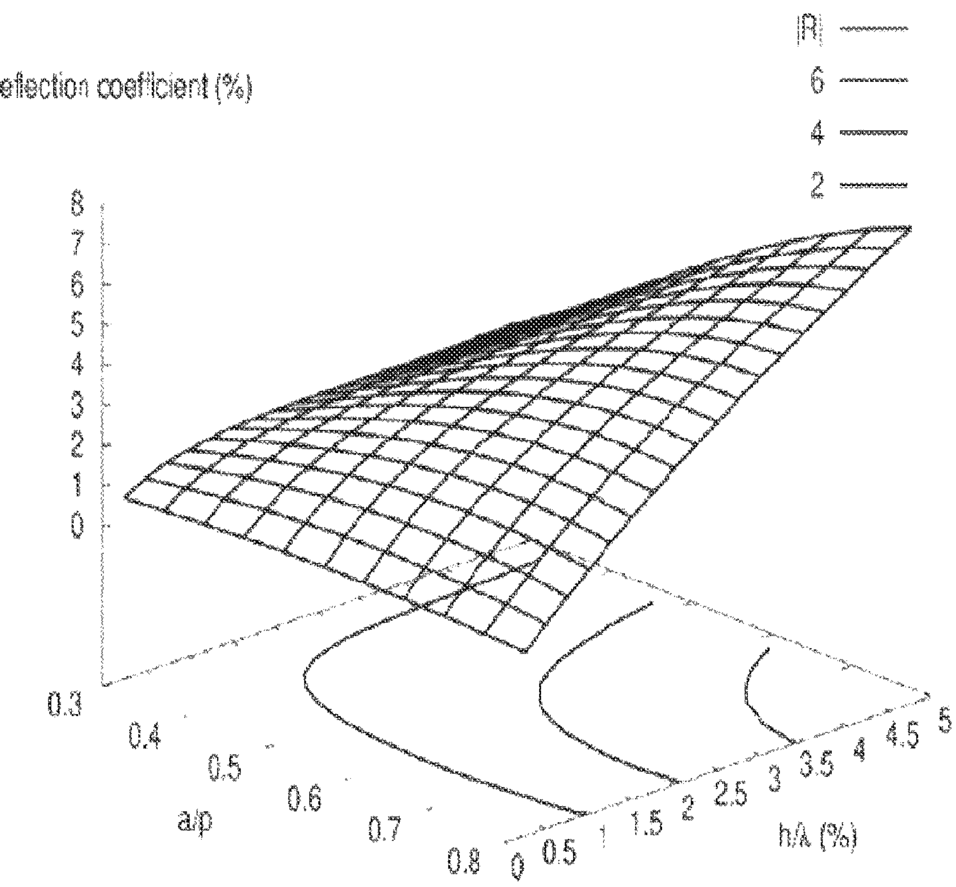
FIG. 7B shows the results of the computation of the variation of the reflection coefficient (%) versus the ratio a/p and h/λ (%) of AlN as reflective grating obstacle material for Rayleigh waves on LGS (YXlt)/48.5°/26.7° of the first embodiment of the present disclosure.

FIGS. 7A and 7B show the results of the computation for AlN-based electrodes.

Figure 8A:
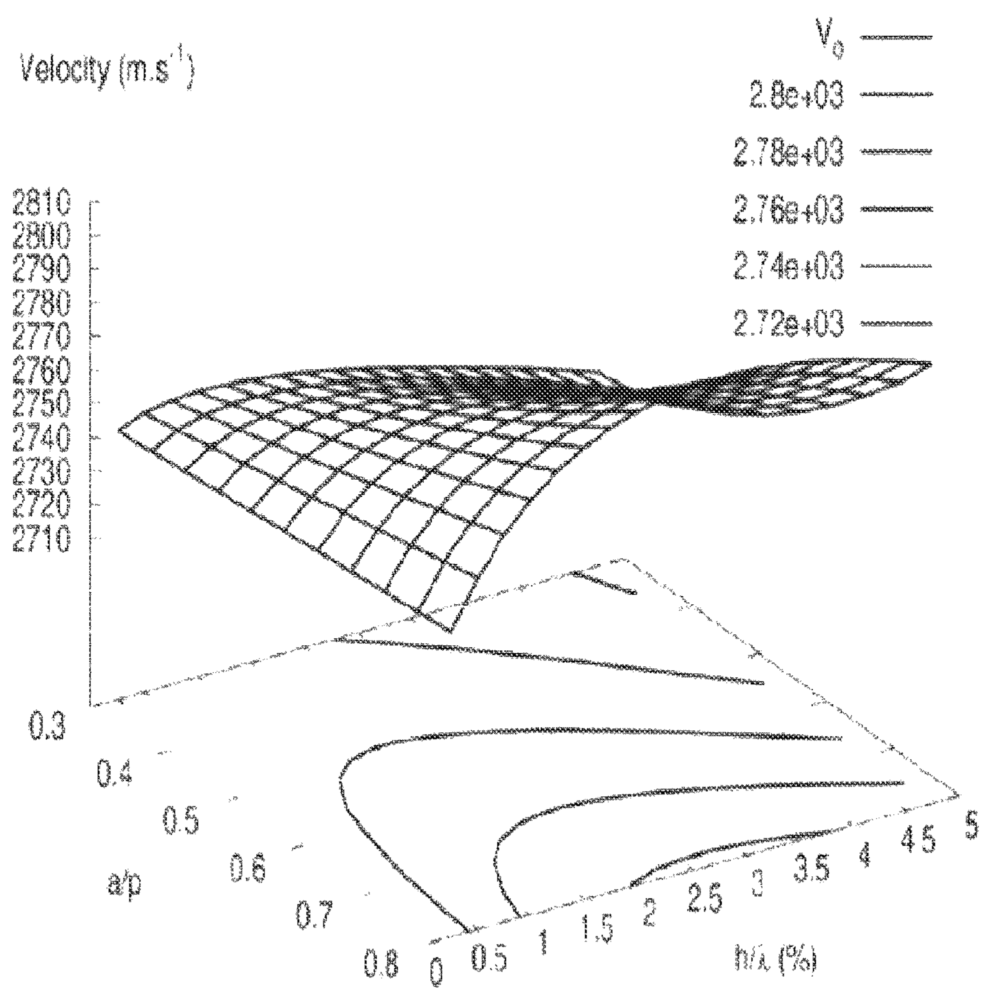
FIG. 8A shows the results of the computation of the variation of the velocity (m/s) versus the ratio a/p and h/λ (%) $Al_2O_3$ as reflective grating obstacle material for Rayleigh waves on LGS (YXlt)/48.5°/26.7° of the first embodiment of the present disclosure.
Figure 8B:
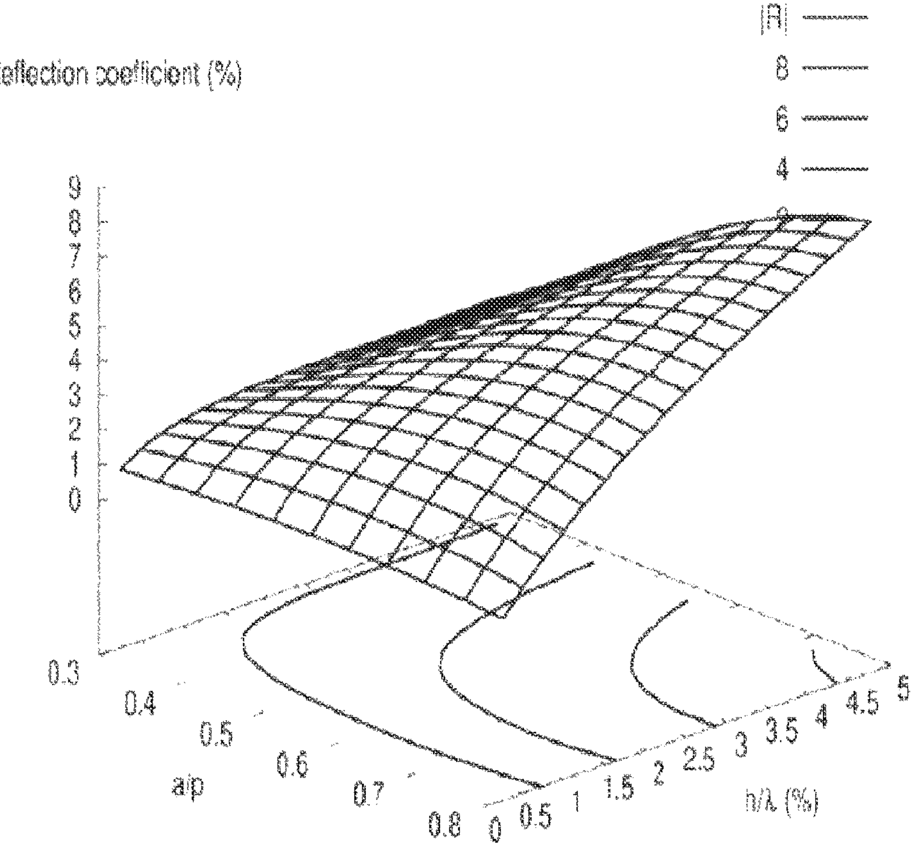
FIG. 8B shows the results of the computation of the variation of the reflection coefficient (%) versus the ratio a/p and h/λ (%) $Al_2O_3$ as reflective grating obstacle material for Rayleigh waves on LGS (YXlt)/48.5°/26.7° of the first embodiment of the present disclosure.

FIGS. 8A and 8B show the results of the computation for $Al_2O_3$-based electrodes.

Figure 9A:
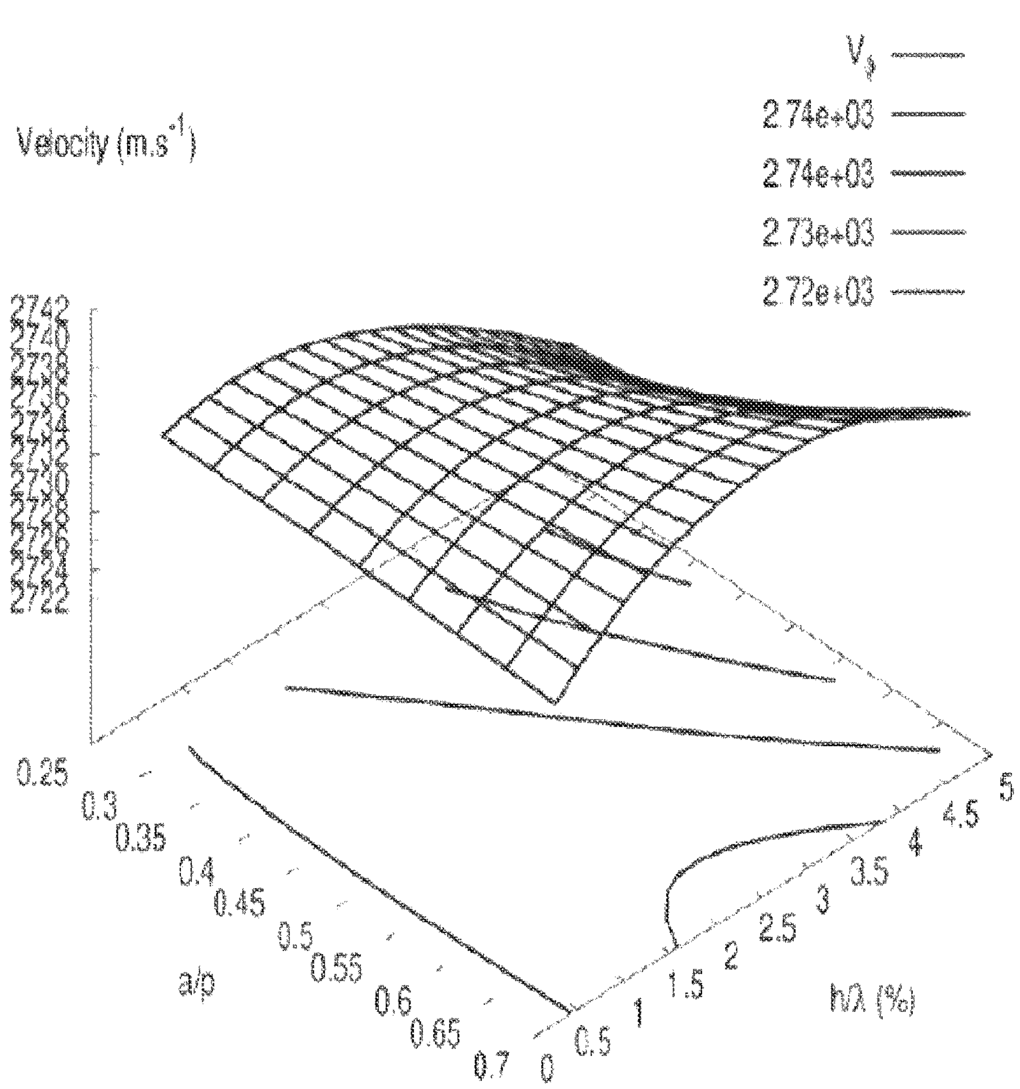
FIG. 9A shows the results of the computation of the variation of the velocity (m/s) versus the ratio a/p and h/λ (%) $SiO_2$ as reflective grating obstacle material for Rayleigh waves on LGS (YXlt)/48.5°/26.7° of the first embodiment of the present disclosure.
Figure 9B:
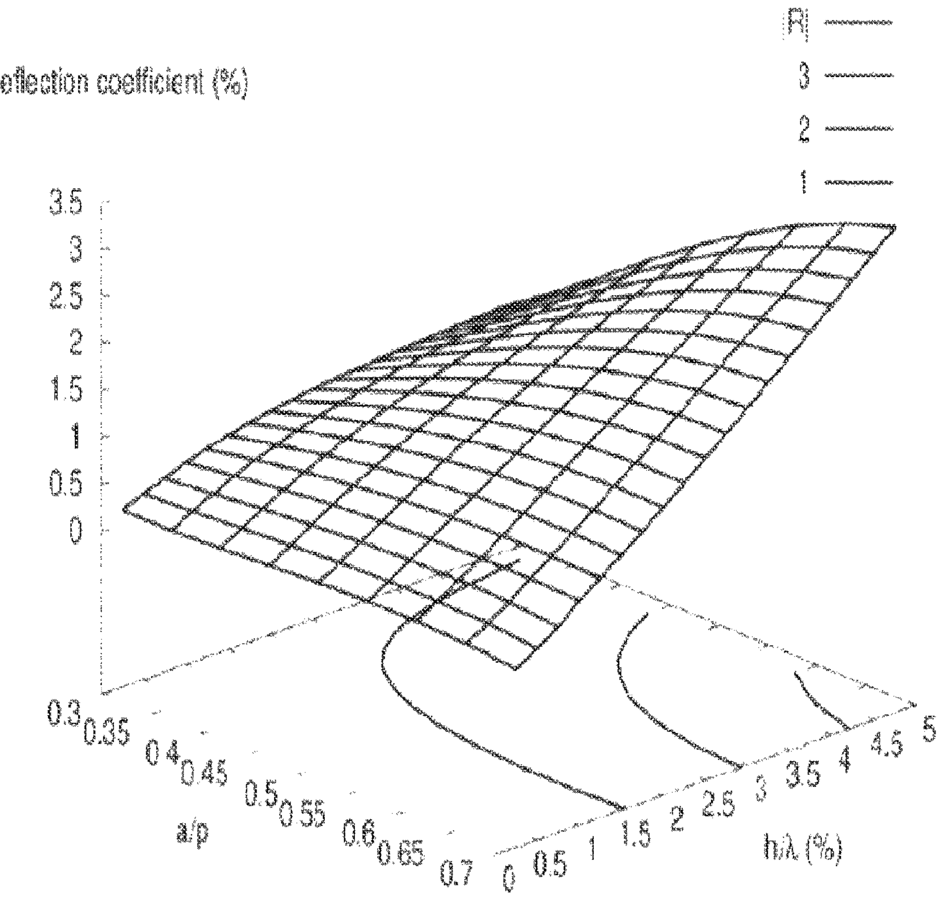
FIG. 9B shows the results of the computation of the variation of the reflection coefficient (%) versus the ratio a/p and h/λ (%) $SiO_2$ as reflective grating obstacle material for Rayleigh waves on LGS (YXlt)/48.5°/26.7° of the first embodiment of the present disclosure.

FIGS. 9A and 9B show the results of the computation for $SiO_2$-based electrodes.

As can be seen for the dielectric materials, AlN, $Al_2O_3$, or $Si_3N_4$, reflection coefficients as high as 6% or even 8% in case of $Al_2O_3$ can be obtained in parameter windows compatible with standard SAW manufacturing processes. Even for $SiO_2$, a reflection coefficient as high as 3% can be obtained. As the geometry of the acoustic wave reflective structure and the IDT can be independently optimized of each other, the SAW device designer therefore gains flexibility.

Furthermore, the phase velocity under dielectric grating/strips is less sensitive to mass load than under metal-based strips. This is of particular importance to control the resonator frequency. Nevertheless, the impact of the IDT metal on the phase velocity cannot be removed because metal electrodes are needed for the wave excitation and detection. Thus, phase velocities can be matched, so that the overall device sensitivity to technological parameters is reduced.

Figure 10A:
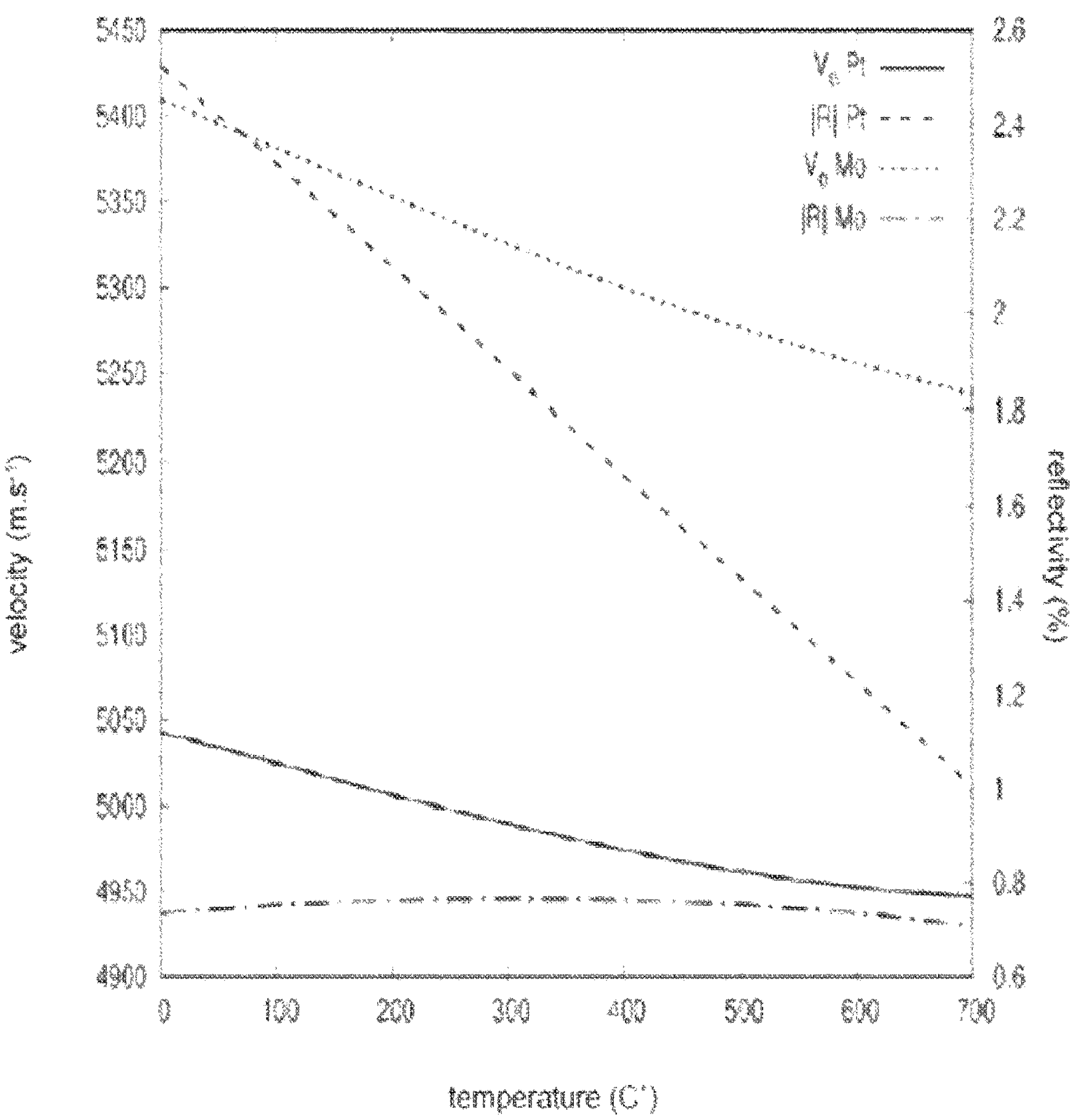
FIG. 10A shows simulated dispersion properties of the velocity and reflectivity of Mo and Pt electrodes on a composite substrate comprising an AlN (YXl)/90° layer on a C-cut Sapphire wafer for an example according to the state of the art.
Figure 10B:
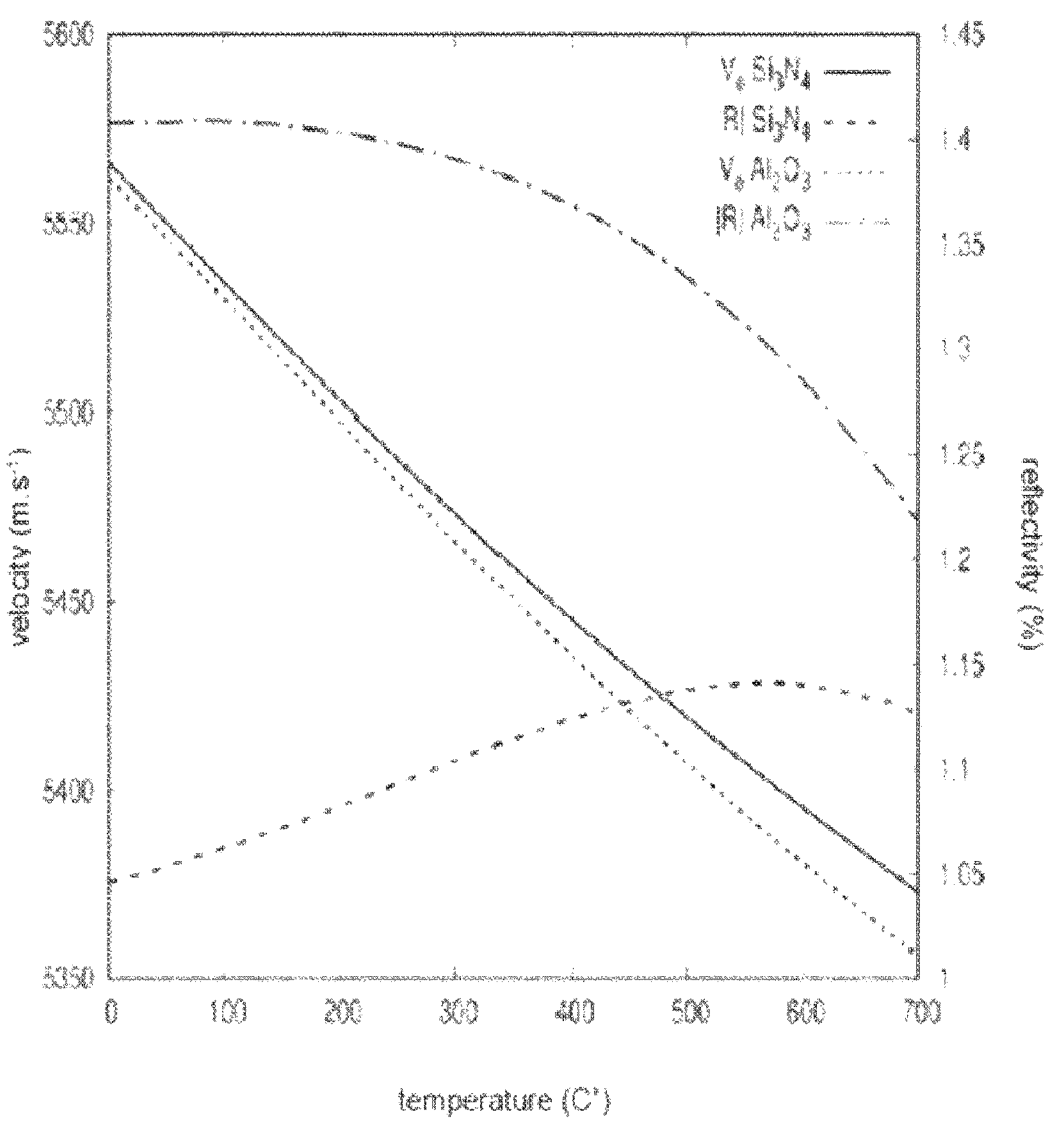
FIG. 10B shows simulated dispersion properties for $Si_3N_4$ and $Al_2O_3$ on a composite substrate comprising a AlN (YXl)/90° layer on a C-cut Sapphire wafer according to the first embodiment of the present disclosure.

FIGS. 10A and 10B illustrate the simulated results when using a composite substrate.

FIG. 10A shows the dispersion properties of Rayleigh waves on a 1 μm thick AlN (YXl)/90° layer on a C-cut Sapphire wafer, at a frequency close to 1 GHz. The surface ratio, namely the ratio between electrode width and grating pitch or mechanical period a/p is fixed to 0.5, and the relative electrode thickness, namely the ratio between absolute electrode height and wavelength h/λ, is fixed to 1%. A wavelength λ of 5.4 μm was set leading to a thickness of 54 nm. The IDT used for excitation and detection of the acoustic waves had the same geometry.

FIG. 10A illustrates the results for Pt-based and Mo-based metallic strips, while FIG. 10B shows the results for $Al_2O_3$ and $Si_3N_4$ based strips according to the present disclosure.

For the Pt-based and Mo-based strips, a coupling factor less than 0.1% is observed both in open and short circuit.

For Pt strips, the reflectivity is rather high at low temperatures, about 2.5% at 0° C., but then drops down to a value of 1%. The Mo strips, in contrast thereto, have a rather constant value of about 0.7%, which, however, is less than 1%. Since the coupling coefficient is lower than 0.1%, this design is still not adapted SAW devices.

For the dielectric-based strips according to the present disclosure, the situation is improved. Like illustrated in FIG. 10B, the variation in the reflection coefficient is from 1.2% to 1.4% for $Al_2O_3$. For $Si_3N_4$, a variation between 1.05% and 1.15% can be observed. Thus, the dielectric reflective structures show a better stability of the reflection coefficient compared to the metal-based strips.

FIGS. 11A and 11B illustrate the results of the computation of the variation of (a) the velocity (m/s) and (b) the reflection coefficient (%) versus the ratio a/p and h/λ (%) for $Al_2O_3$-based electrodes for the AlN (YXl)/90° layer on a C-cut Sapphire wafer. Geometric parameters can be found for the acoustic wave reflective structure that lead to reflection coefficients going even up to 10%.

FIGS. 12A and 12B illustrate the results of the computation of the variation of (a) the velocity (m/s) and (b) the reflection coefficient (%) versus the ratio a/p and h/λ (%) for $Al_2O_3$-based electrodes on a different composite substrate, namely GaN (YXl)/90° layer on a C-cut Sapphire wafer. Also in this example according to the present disclosure, the reflectivity can go up to 10%.

FIG. 13 illustrates a schematic of a method for manufacturing a surface acoustic wave SAW device according to a fifth embodiment of the present disclosure. The method is used to obtain a SAW device 200 according to the second embodiment, features carrying the same reference numeral as already used above will not be described in detail again, but reference is made.

The method comprises a first step 400 of providing an acoustic wave propagating substrate 114 and forming the interdigitated transducer structure 102 with its comb electrodes 108 and 110 using a combination of layer deposition and patterning steps.

According to the present disclosure, the method further comprises a step 402 of forming a dielectric layer 500 on the substrate 114. The dielectric is one of the dielectric materials as mentioned above. Thus, AlN, GaN, $Al_2O_3$, $Si_3N_4$, $Ta_2O_5$ or $SiO_2$. Here the layer 500 covers the entire surface of the substrate 114, thus also the IDT 102.

Next, following a patterning step 404, the acoustic wave reflective structures 104 and 106 and the passivation layer 220 are formed. The patterning of the dielectric layer 500 comprises a resist coating step, a lithography step and a material removal step, like etching. Thus, in one process step, the acoustic wave reflective structures 104, 106 and the passivation layer 220 is obtained. Thus, the method according to the present disclosure is not more complicated than the fabrication process of the state of the art for a SAW device with metallic reflective structures and a passivation layer on the IDT.

According to a sixth embodiment shown in FIG. 14, the strips 612 of the acoustic wave reflective structures 604, 606 can also be formed in the acoustic wave propagating substrate 614 so that they are at least partially embedded.

In this case, a patterning step, e.g., lithography and etching, is used to form grooves 640, 642 in the substrate 114 on both sides of the transducer structure 102 as illustrated in step 410.

Subsequently, as illustrated by step 412, the dielectric layer 616 is formed over the whole surface of the acoustic wave substrate 114.

Following a subsequent material removal step 414, e.g., mechanical and/or chemical material removal step, the acoustic wave reflective structures 604, 606 are formed by the strips 612 present in the grooves 640 and 642.

In this embodiment, the acoustic wave reflective structures 604, 606 are fully embedded within the acoustic wave propagating substrate 114 and filled with dielectric material. In a variant of the present disclosure, the acoustic wave reflective structure can also be partially embedded only so that the strips also extend above the substrate. In a further variant, the IDT 102 may also be at least partially embedded.

FIG. 15 illustrates a schematic of a method for manufacturing a surface acoustic wave device according to a seventh embodiment. With this method, the SAW device 100 according to the first embodiment can be obtained. Again, features carrying the same reference numeral as already used above will not be described in detail again, but reference is made thereto.

The method is based on the fifth embodiment illustrated in FIG. 13.

After providing the substrate 114 with the IDT 102, see step 420, a resist coating 720 is provided over the IDT 102. Then the dielectric layer 500 is formed, see step 422. Thus, the dielectric layer 500 is not directly deposited on the transducer structure 102 as in FIG. 13.

Then, as illustrated by step 424, a lift-off process is performed to remove the resist coating 720 and the dielectric layer 716 at the transducer structure 102 location.

Finally, after a subsequent patterning of the dielectric layer 716 as illustrated in step 426 the acoustic wave reflective structures 104, 106 are obtained next to the transducer structure 102. In this embodiment, the transducer structure 102 thus does not comprise a passivation layer at the end of the process.

A subsequent deposition step could be performed to add a passivation layer of a different material than the one of the acoustic wave reflective structures.

The present disclosure provides SAW devices on materials compatible with high temperature application such as single piezoelectric crystals like LGS and related substrates or AlN/Silicon or GaN/Sapphire, using dielectric-based reflective structures and to obtain effective reflectivity up to 6% being less variable over temperature fluctuations of several hundred Celsius degrees compared to metallic-based reflective structures of the state of the art.

A number of embodiments of the present disclosure have been described. Nevertheless, it is understood that various modifications and enhancements may be made without departing the following claims.

The invention claimed is:

1. A surface acoustic wave (SAW) device, comprising:
an acoustic wave propagating substrate;
an interdigitated transducer structure on or in the acoustic wave propagating substrate, the interdigitated transducer structure comprising a first material; and
at least one acoustic wave reflective structure on or in the acoustic wave propagating substrate, the at least one acoustic wave reflective structure comprising a second material;
wherein:
an acoustic impedance $\rho C_{ref}$ of the second material and an acoustic impedance $\rho C_{sub}$ of the acoustic wave propagating substrate are matched, such that $$\frac{|\rho C_{ref} - \rho C_{sub}|}{\rho C_{sub}}$$

is less than 50%;
the second material is different from the first material; and/or
the acoustic wave reflective structure and the interdigitated transducer structure have different geometrical parameters.

2. The SAW device of claim 1, wherein the acoustic wave propagating substrate is a composite substrate comprising a piezoelectric layer over a base substrate.

3. The SAW device of claim 2, wherein the second material is a dielectric material, and the piezoelectric layer of the composite substrate is lithium tantalate ($LiTaO_3$) and the dielectric material is lithium tantalate ($LiTaO_3$) or tantalum oxide ($Ta_2O_5$) or aluminum oxide ($Al_2O_3$) or langasite (LGS) or gallium nitride (GaN).

4. The SAW device of claim 2, wherein the composite substrate is a piezoelectric on insulator (POI) substrate.

5. The SAW device of claim 2, wherein the second material is a dielectric material, and the piezoelectric layer of the composite substrate is lithium niobate ($LiNbO_3$) and the dielectric material is lithium niobate ($LiNbO_3$) or tantalum oxide ($Ta_2O_5$) or aluminum oxide ($Al_2O_3$) or langasite (LGS).

6. The SAW device of claim 2, wherein the second material is a dielectric material, and the piezoelectric layer of the composite substrate is gallium nitride (GaN) and the dielectric material is aluminum oxide ($Al_2O_3$) or aluminum nitride (AlN) or lithium niobate ($LiNbO_3$) or langasite (LGS) or gallium nitride (GaN).

7. The SAW device of claim 2, wherein the second material is a dielectric material, and the piezoelectric layer of the composite substrate is aluminum nitride (AlN) and the dielectric material is tantalum oxide ($Ta_2O_5$) or aluminum oxide ($Al_2O_3$) or gallium nitride (GaN) or langasite (LGS) or aluminum nitride (AlN).

8. The SAW device of claim 1, wherein the first material and the second material are metals.

9. The SAW device of claim 8, wherein the acoustic wave reflective structure comprises a plurality of metallic strips electrically isolated from each other.

10. The SAW device of claim 9, wherein the second material and its crystal orientation and a material of the acoustic wave propagating substrate and its crystal orientation are such that the electrical and mechanical contribution to acoustic wave reflection are out of phase.

11. The SAW device of claim 1, further comprising a second interdigitated transducer structure, the interdigitated transducer structures being electrically connected to each other and separated from each other by an additional reflective structure.

12. The SAW device of claim 11, wherein the interdigitated transducer structure comprises the first material and the at least one acoustic wave reflective structure comprises the second material, and the additional reflective structure comprises a third material different from the second material.

13. The SAW device of claim 1, wherein the acoustic wave reflective structure and the interdigitated transducer structure have the different geometrical parameters, and the geometrical parameters are a width of the acoustic wave reflective structure and a width of the interdigitated transducer structure or a height of the acoustic wave reflective structure and a height of the interdigitated transducer.

14. A surface acoustic wave (SAW) device, comprising:
an acoustic wave propagating substrate;
an interdigitated transducer structure on or in the acoustic wave propagating substrate, the interdigitated transducer structure comprising a first material; and
at least one acoustic wave reflective structure on or in the acoustic wave propagating substrate, the at least one acoustic wave reflective structure comprising a plurality of parallel strips, the strips of the at least one acoustic wave reflective structure being made of a second material;
wherein:
the second material is a dielectric material; and
the second material is different from the first material and/or the acoustic wave reflective structure and the interdigitated transducer structure have different geometrical parameters.

15. The SAW device of claim 14, wherein a passivation layer is present only over the interdigitated transducer structure.

16. The SAW device of claim 15, wherein the passivation layer and the at least one reflective structure are made of the same dielectric material.

17. The SAW device of claim 14, wherein the acoustic wave propagating substrate comprises aluminum nitride (AlN) as piezoelectric material, and the dielectric material comprises aluminum oxide ($Al_2O_3$) or lithium tantalate ($LiTaO_3$) or aluminum nitride (AlN) or langasite (LGS).

18. The SAW device of claim 14, wherein the acoustic wave propagating substrate comprises langasite (LGS) as piezoelectric material, and the dielectric material comprises aluminum oxide ($Al_2O_3$) or aluminum nitride (AlN) or lithium niobate ($LiNbO_3$) or lithium tantalate ($LiTaO_3$).

19. The SAW device of claim 14, wherein the acoustic wave propagating substrate comprises gallium nitride (GaN) as piezoelectric material, and the dielectric material comprises tantalum oxide ($Ta_2O_5$) or aluminum oxide ($Al_2O_3$) or gallium nitride (GaN) or aluminum nitride (AlN) or lithium niobate ($LiNbO_3$) or lithium tantalate ($LiTaO_3$).

20. The SAW device of claim 14, wherein the acoustic wave propagating substrate is a composite substrate comprising a piezoelectric layer over a base substrate.

21. The SAW device of claim 14, wherein the acoustic wave reflective structure and the interdigitated transducer structure have the different geometrical parameters, and the geometrical parameters are a width of the acoustic wave reflective structure and a width of the interdigitated transducer structure or a height of the acoustic wave reflective structure and a height of the interdigitated transducer.

22. The SAW device of claim 14, further comprising a second interdigitated transducer structure, the interdigitated transducer structures being electrically connected to each other and separated from each other by an additional reflective structure.

23. A surface acoustic wave (SAW) device, comprising:

an acoustic wave propagating substrate;

an interdigitated transducer structure on or in the acoustic wave propagating substrate, the interdigitated transducer structure comprising a first material; and at least one acoustic wave reflective structure on or in the acoustic wave propagating substrate, the at least one acoustic wave reflective structure comprising a second material;

wherein:

the at least one acoustic wave reflective structure comprises a first acoustic wave reflective structure on one side of the interdigitated transducer structure and a second acoustic wave reflective structure on an opposing side of the interdigitated transducer structure; and the first acoustic wave reflective structure comprises a material differing from a material of the second acoustic wave reflective structure and/or the first acoustic wave reflective structure has a pitch differing from a pitch of the second acoustic wave reflective structure.

24. The SAW device of claim 23, wherein the acoustic wave propagating substrate is a composite substrate comprising a piezoelectric layer over a base substrate.

25. The SAW device of claim 23, further comprising a second interdigitated transducer structure, the interdigitated transducer structures being electrically connected to each other and separated from each other by an additional reflective structure.

* * * * *